United States Patent
Niimi et al.

(10) Patent No.: US 12,306,496 B2
(45) Date of Patent: May 20, 2025

(54) LIGHT-EMITTING DEVICE

(71) Applicant: NICHIA CORPORATION, Anan (JP)

(72) Inventors: Satoru Niimi, Anan (JP); Chihiro Yamada, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/818,914

(22) Filed: Aug. 29, 2024

(65) Prior Publication Data

US 2025/0085589 A1 Mar. 13, 2025

(30) Foreign Application Priority Data

Sep. 12, 2023 (JP) ................. 2023-147431

(51) Int. Cl.

| | |
|---|---|
| *G02F 1/13357* | (2006.01) |
| *G02F 1/1335* | (2006.01) |
| *H01L 25/075* | (2006.01) |
| *H10H 20/853* | (2025.01) |
| *H10H 20/855* | (2025.01) |
| *H10H 20/856* | (2025.01) |
| *H10H 20/857* | (2025.01) |

(52) U.S. Cl.
CPC .. *G02F 1/133605* (2013.01); *G02F 1/133612* (2021.01); *H01L 25/0753* (2013.01); *H10H 20/853* (2025.01); *H10H 20/855* (2025.01); *H10H 20/856* (2025.01); *H10H 20/857* (2025.01)

(58) Field of Classification Search
CPC .. H10H 20/856; H10H 20/853; H10H 20/857; G02F 1/133612
See application file for complete search history.

(56) References Cited

U.S. PATENT DOCUMENTS

| | | |
|---|---|---|
| 6,559,390 B1 | 5/2003 | Tanaka |
| 6,774,497 B1 | 8/2004 | Qi et al. |
| 2002/0033525 A1 | 3/2002 | Ohuchi |
| 2013/0240942 A1* | 9/2013 | Inoue ................... H10H 20/855 257/98 |

(Continued)

FOREIGN PATENT DOCUMENTS

| | | |
|---|---|---|
| JP | 2000188469 A | 7/2000 |
| JP | 2002118209 A | 4/2002 |

(Continued)

*Primary Examiner* — Karabi Guharay
(74) *Attorney, Agent, or Firm* — Hunton Andrews Kurth LLP

(57) ABSTRACT

A light-emitting device includes a wiring substrate, a reflecting member positioned at an upper side of the wiring substrate, a light source positioned at an upper side of the reflecting member, and a bonding member; the wiring substrate includes a first wiring part and a second wiring part at an upper surface of the wiring substrate; the reflecting member has a first through-hole including a first inclined surface spreading upward; the light source includes a first electrode and a second electrode; the bonding member includes a first conductive part and a resin part; the first conductive part is positioned in the first through-hole and electrically connects the first wiring part and the first electrode; and the resin part contacts the first inclined surface, the light source, and the first conductive part.

8 Claims, 19 Drawing Sheets

(56) References Cited

U.S. PATENT DOCUMENTS

| | | | |
|---|---|---|---|
| 2014/0014992 A1* | 1/2014 | Tsuchiya | H01L 33/60 |
| | | | 438/27 |
| 2018/0212129 A1 | 7/2018 | Saito et al. | |
| 2021/0239296 A1 | 8/2021 | Nakabayashi et al. | |
| 2023/0207756 A1 | 6/2023 | Yamada | |

FOREIGN PATENT DOCUMENTS

| | | |
|---|---|---|
| JP | 2006521703 A | 9/2006 |
| JP | 2013055208 A | 3/2013 |
| JP | 2021125453 A | 8/2021 |
| JP | 2023096345 A | 7/2023 |
| WO | 2016017673 A1 | 2/2016 |

\* cited by examiner

LIGHT-EMITTING DEVICE

CROSS-REFERENCE TO RELATED APPLICATIONS

The present application claims priority under 35 U.S.C. § 119 to Japanese Patent Application No. 2023-147431, filed Sep. 12, 2023, the content of which is hereby incorporated by reference in its entirety.

BACKGROUND

1. Technical Field

Embodiments described herein relate generally to a light-emitting device.

2. Description of Related Art

Light-emitting devices that combine a wiring substrate, a light source, and a reflecting member are widely utilized, for example, in backlights of liquid crystal displays, etc. For example, Japanese Patent Publication No. 2021-125453 discusses a light-emitting device including a wiring substrate, a light source positioned on the wiring substrate, and a reflecting member positioned on the wiring substrate and positioned at a periphery of the light source.

SUMMARY

According to an aspect of the present disclosure, a light-emitting device includes a wiring substrate, a reflecting member positioned at an upper side of the wiring substrate, a light source positioned at an upper side of the reflecting member, and a bonding member; the wiring substrate includes a first wiring part and a second wiring part at an upper surface of the wiring substrate; the reflecting member has a first through-hole including a first inclined surface spreading upward; the light source includes a first electrode and a second electrode; the bonding member includes a first conductive part and a resin part; the first conductive part is positioned in the first through-hole and electrically connects the first wiring part and the first electrode; and the resin part contacts the first inclined surface, the light source, and the first conductive part.

BRIEF DESCRIPTION OF THE DRAWINGS

A more complete appreciation of embodiments of the present disclosure and many of the attendant advantages thereof will be readily obtained by reference to the following detailed description when considered in connection with the accompanying drawings.

DETAILED DESCRIPTION

Figure 1:
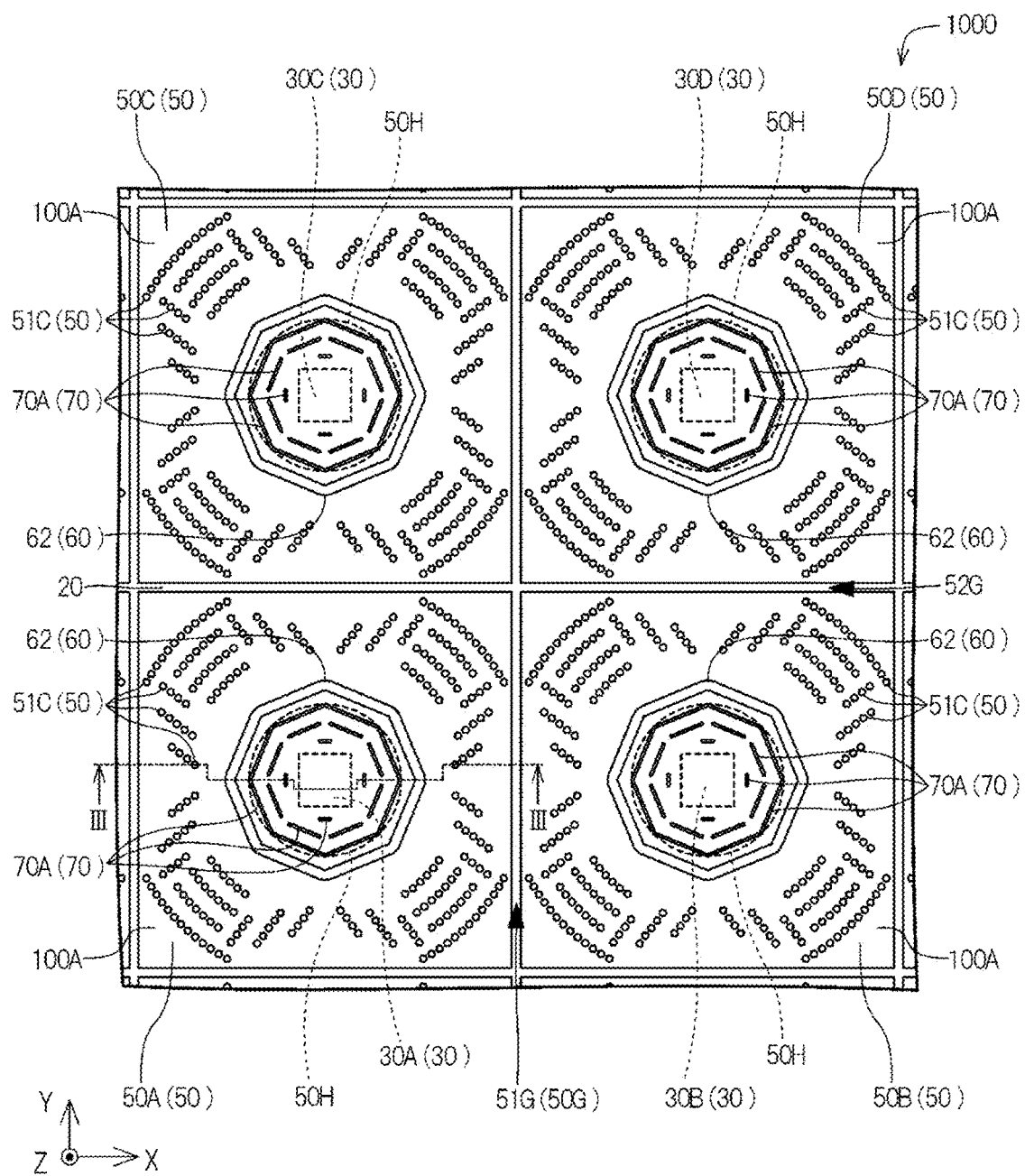
FIG. 1 is a schematic top view of a light-emitting device according to an embodiment of the present disclosure.

Embodiments will now be described with reference to the drawings. Because the drawings schematically show embodiments, the scales, spacing, positional relationships, and the like of the members may be exaggerated, or some of the members may not be illustrated. In the specification, an arrow direction of a Z-axis is taken as up, and the direction at the opposite side of the arrow direction of the Z-axis is taken as down. Viewing an object from above is referred to as viewing in top-view; and viewing in top-view is synonymous with viewing in plan. End views that show only cross sections may be used as cross-sectional views.

In the following description, components that have substantially the same function may be shown using common reference numerals; and a description may be omitted.

Terms that indicate specific directions or positions (e.g., "up/above", "down/below", and other terms including such terms) may be used. Such terms, however, are used merely for better understanding of relative directions or positions when referring to the drawings. As long as the relationships are the same, the relative directions or positions according to terms such as "up/above", "down/below", etc., used when referring to the drawings may not have the same arrangements in drawings, actual products, and the like outside the disclosure. In the specification, "parallel" includes not only the case where two straight lines, sides, surfaces, etc., do not cross even when extended, but also the case where the two straight lines, sides, surfaces, etc., cross at an angle within 10°. The positional relationship referred to as "on" in the specification includes the case of being in contact and the case of being positioned above without contact.

Embodiments

A light-emitting device 1000 of an embodiment will now be described with reference to FIGS. 1 to 14. FIG. 1 is a drawing when viewed from the light-emitting surface side of the light-emitting device 1000. As shown in FIG. 1, two directions that are parallel to the light-emitting surface of the light-emitting device 1000 and orthogonal to each other are taken as an X-direction and a Y-direction. A direction orthogonal to the X-direction and Y-direction is taken as a Z-direction. In the specification, there are cases where a plane parallel to the X-direction and Y-direction is called an XY-plane. A direction that is in the XY-plane and is tilted at an angle of not less than 0° but less than 360° from the X-direction may be called a horizontal direction; and the Z-direction may be called the vertical direction.

The light-emitting device 1000 includes a wiring substrate 10, a reflecting member 20, a light source 30, and a bonding member 40. The wiring substrate 10 includes a first wiring part 11P and a second wiring part 12P at an upper surface 10A of the wiring substrate 10. The reflecting member 20 is positioned at the upper side of the wiring substrate 10. The reflecting member 20 has a first through-hole 21H. The first through-hole 21H of the reflecting member 20 includes a first inclined surface 21A spreading upward. The light source 30 is positioned at the upper side of the reflecting member 20. The light source 30 includes a first electrode 31E and a second electrode 32E. The bonding member 40 includes a first conductive part 41E and a resin part 40R. The first conductive part 41E is positioned in the first through-hole 21H. The first conductive part 41E electrically connects the first wiring part 11P and the first electrode 31E. The resin part 40R contacts the first inclined surface 21A, the light source 30, and the first conductive part 41E.

The bonding strength of the light source 30 and the reflecting member 20 can be increased by the resin part 40R contacting the first inclined surface 21A and the light source 30.

Components included in the light-emitting device 1000 will now be elaborated.

Wiring Substrate 10

Figure 3:
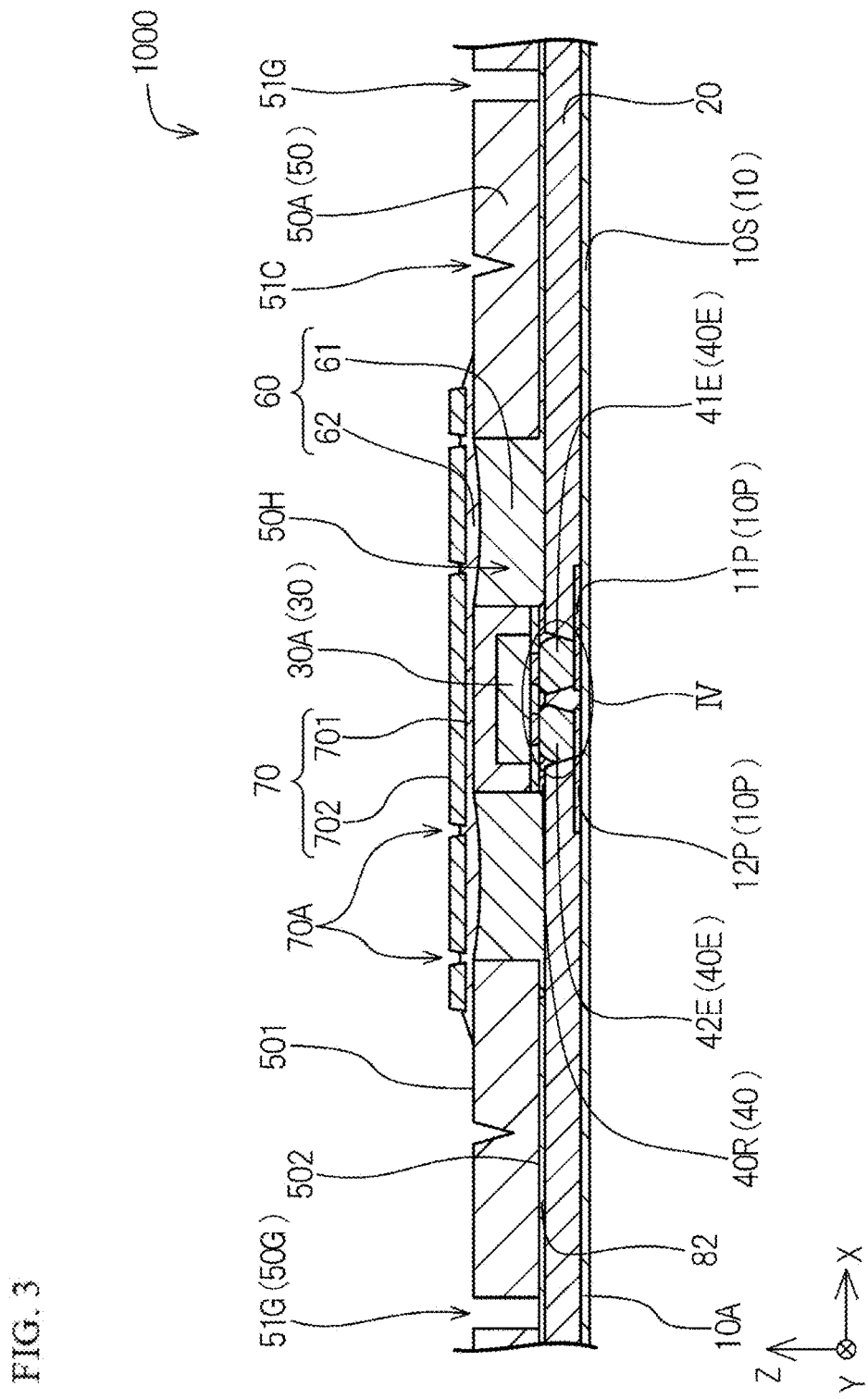
FIG. 3 is a schematic cross-sectional view of the light-emitting device along line III-III of FIG. 1.
Figure 4:
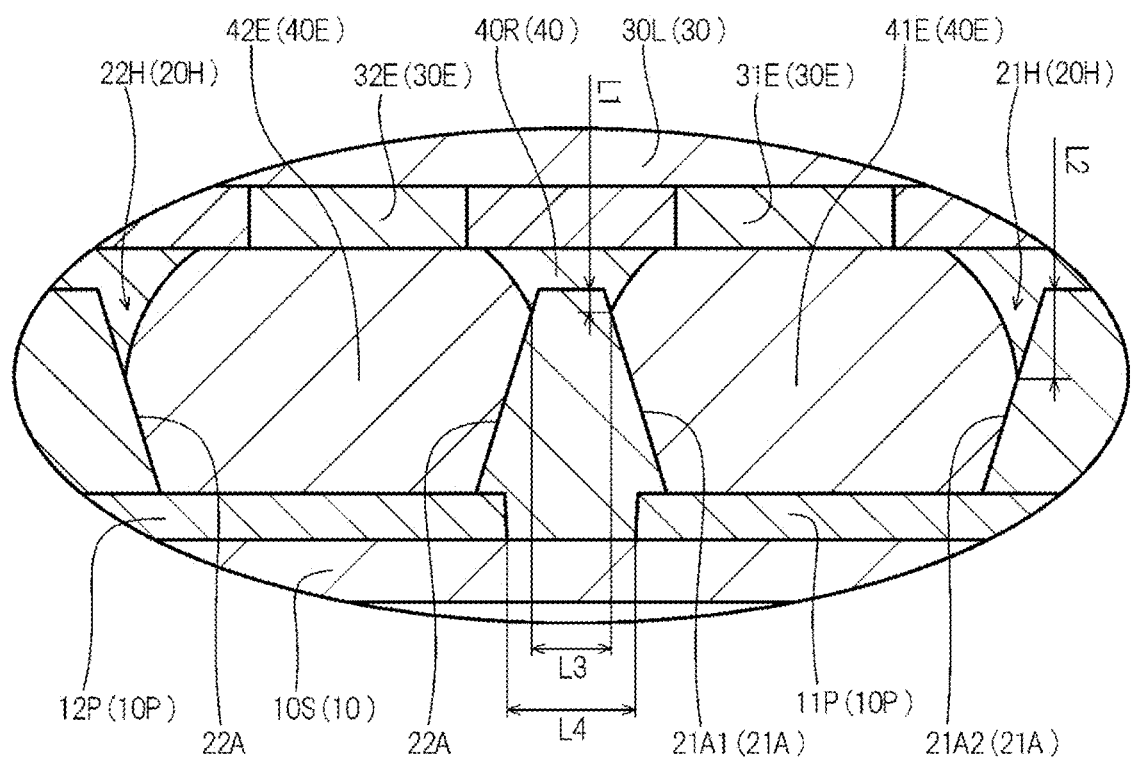
FIG. 4 is an enlarged schematic view of the light-emitting device in portion IV of FIG. 3.
Figure 5:
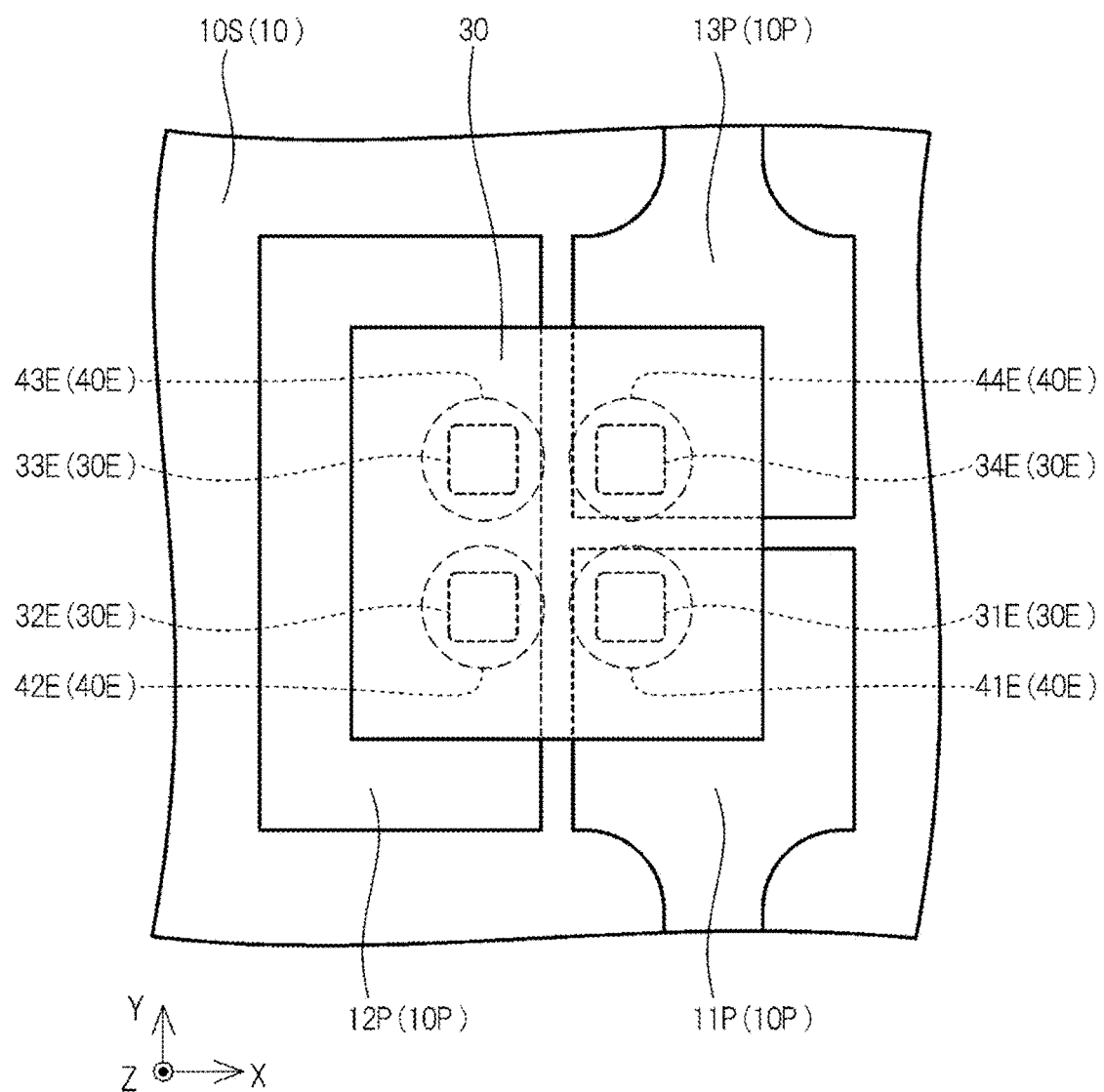
FIG. 5 is a schematic top view of a light source and a wiring substrate.

The wiring substrate 10 is a member supplying power to the light source 30. The wiring substrate 10 includes an insulating base member 10S and a conductive wiring part 10P. The base member 10S may be a rigid substrate or a flexible substrate. To make the light-emitting device 1000 smaller in the vertical direction, it is favorable for the base member 10S to be a flexible substrate. The base member 10S may include a single layer in the vertical direction, or may include a stacked body of multiple layers. For example, the base member 10S may include a single-layer flexible substrate, or may include a stacked body of multiple rigid substrates. For example, a resin such as polyimide, etc., can be used as the material of the base member 10S. As shown in FIGS. 3 and 4, the wiring substrate 10 includes the wiring parts 10P positioned at the upper surface of the base member 10S. The number of the wiring parts 10P included in the wiring substrate 10 may be two, three, four, or more. As shown in FIG. 5, the wiring parts 10P of the embodiment include the first wiring part 11P, the second wiring part 12P, and a third wiring part 13P. The reflecting member 20 is not illustrated in FIG. 5 for easier understanding of the shapes of the wiring parts 10P. The wiring parts 10P are metal films, e.g., copper films. The wiring parts 10P can be formed by a known method such as electroplating, electroless plating, vapor deposition, sputtering, etc.

Reflecting Member 20

The reflecting member 20 is a member that is reflective to the light emitted by the light source 30. The reflectance of the reflecting member 20 for the light from the light source 30 can be, for example, not less than 60%, favorably not less than 70%, and more favorably not less than 90%. In the specification, the reflectance refers to the reflectance for the peak wavelength of the light source 30.

For example, a resin member that includes a gas such as nitrogen and/or oxygen or the like, a resin member that includes light-scattering particles, etc., can be used as the material of the reflecting member 20. It is favorable for the reflecting member 20 to include a resin member as a base material. By including a resin member in the reflecting member 20, the thermal expansion coefficients of the reflecting member 20 and the resin part 40R can easily approach each other. As a result, the adhesion between the reflecting member 20 and the resin part 40R is easily improved. For example, a thermoplastic resin such as an acrylic resin, a polycarbonate resin, a cyclic polyolefin resin, a polyethylene terephthalate resin, a polyester resin, or the like, a thermosetting resin such as an epoxy resin, a silicone resin, etc., can be used as the resin member of the reflecting member 20. For example, particles of titania, silica, alumina, zinc oxide, magnesium oxide, zirconia, yttria, calcium fluoride, magnesium fluoride, niobium pentoxide, barium titanate, tantalum pentoxide, barium sulfate, glass, etc., can be used as the light-scattering particles of the reflecting member 20. The reflecting member 20 may include both a gas and light-scattering particles.

As shown in FIG. 3, the reflecting member 20 is positioned at the upper side of the wiring substrate 10. It is favorable for the reflecting member 20 to contact the upper surface of the wiring substrate 10. As a result, it is easier to make the light-emitting device 1000 smaller in the vertical direction. As in a light-emitting device 1001 shown in FIG. 8, the wiring substrate 10 and the reflecting member 20 may be fixed by a first adhesive layer 81 located between the wiring substrate 10 and the reflecting member 20. The first adhesive layer 81 can include, for example, a resin member including light-scattering particles. For example, a material similar to that of the resin member of the reflecting member 20 can be used as the resin member of the first adhesive layer 81. For example, a material similar to that of the light-scattering particles of the reflecting member 20 can be used as the light-scattering particles of the first adhesive layer 81. A sheet-like optically clear adhesive may be used as the first adhesive layer 81.

Figure 6:
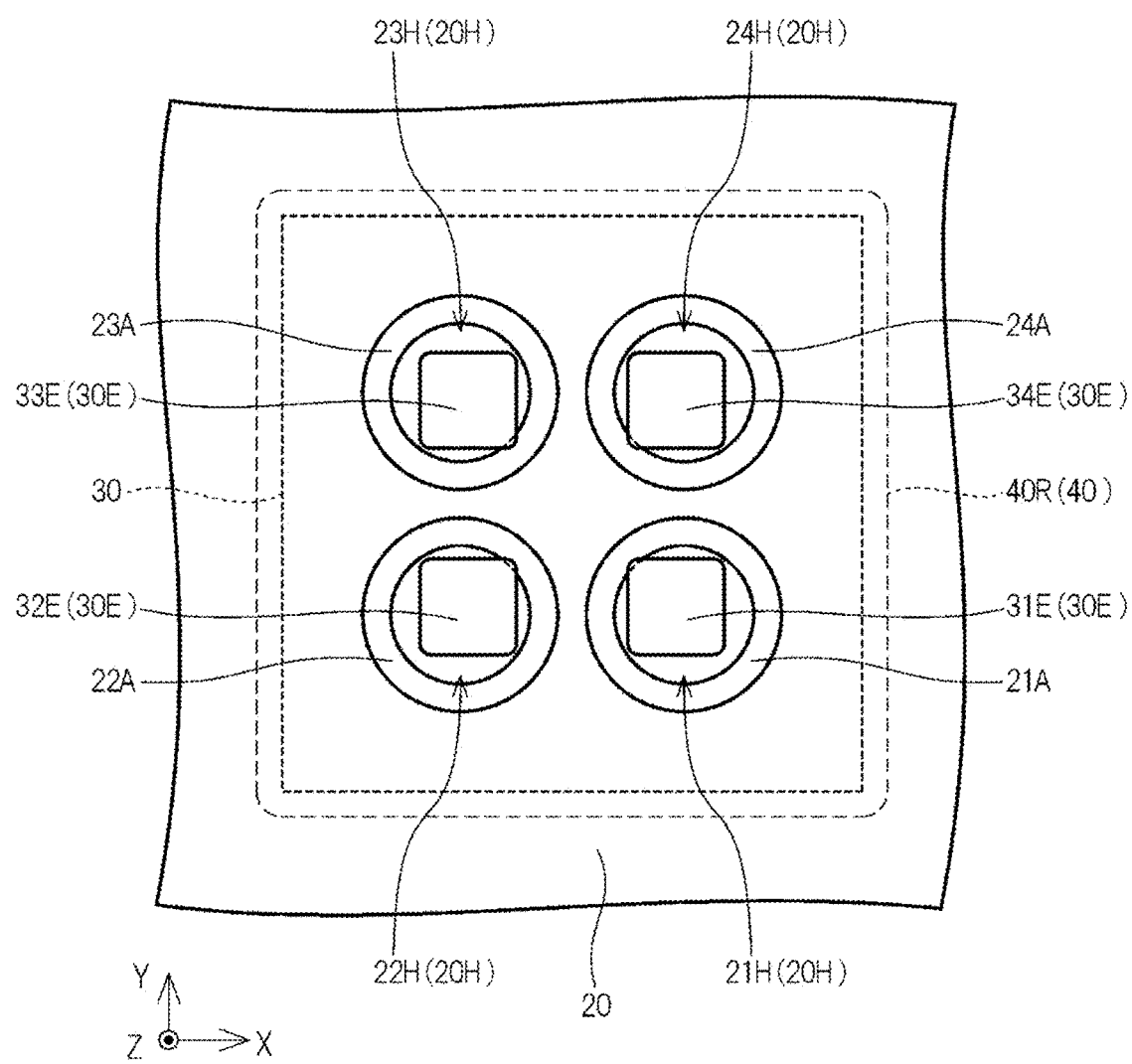
FIG. 6 is a schematic top view of electrodes and a reflecting member of the light source.

As shown in FIG. 6, the reflecting member 20 of the embodiment includes multiple through-holes (hereinbelow, called reflecting through-holes 20H) including the first through-hole 21H, a second through-hole 22H, a third through-hole 23H, and a fourth through-hole 24H. The first through-hole 21H of the reflecting member 20 includes the first inclined surface 21A spreading upward. When viewed in cross-section as shown in FIG. 4, the first inclined surface 21A of the reflecting member 20 defining the first through-hole 21H is inclined so that the horizontal-direction length of the first through-hole 21H increases from the lower surface side of the reflecting member 20 toward the upper surface side of the reflecting member 20. The second through-hole 22H of the reflecting member 20 includes a second inclined surface 22A spreading upward. The third through-hole 23H of the reflecting member 20 includes a third inclined surface 23A spreading upward. The fourth through-hole 24H of the reflecting member 20 includes a fourth inclined surface 24A spreading upward. The inner surface that defines the reflecting through-holes 20H may not be inclined in the vertical direction. The reflecting through-holes 20H of the embodiment are circular when viewed in top-view. The reflecting through-holes 20H may be elliptic or polygonal such as triangular, quadrilateral, hexagonal, octagonal, etc., when viewed in top-view.

Portions of the wiring parts 10P of the wiring substrate 10 are not covered with the reflecting through-holes 20H of the reflecting member 20 when viewed in top-view. According to the embodiment, when viewed in top-view, a portion of the first wiring part 11P is not covered with the first through-hole 21H; a portion of the second wiring part 12P is not covered with the second through-hole 22H; a portion of the second wiring part 12P is not covered with the third through-hole 23H; and a portion of the third wiring part 13P is not covered with the fourth through-hole 24H.

Light Source 30

As shown in FIG. 3, the light source 30 is positioned at the upper side of the reflecting member 20. The light source 30 includes at least a positive and negative pair of electrodes 30E. As shown in FIGS. 5 and 6, the light source 30 according to the embodiment includes the multiple electrodes 30E including the first electrode 31E, the second electrode 32E, a third electrode 33E, and a fourth electrode 34E. As shown in FIG. 1, the light-emitting device 1000 includes the multiple light sources 30 including a first light source 30A, a second light source 30B, a third light source 30C, and a fourth light source 30D. The number of the light sources 30 included in the light-emitting device 1000 may be one.

Figure 7A:
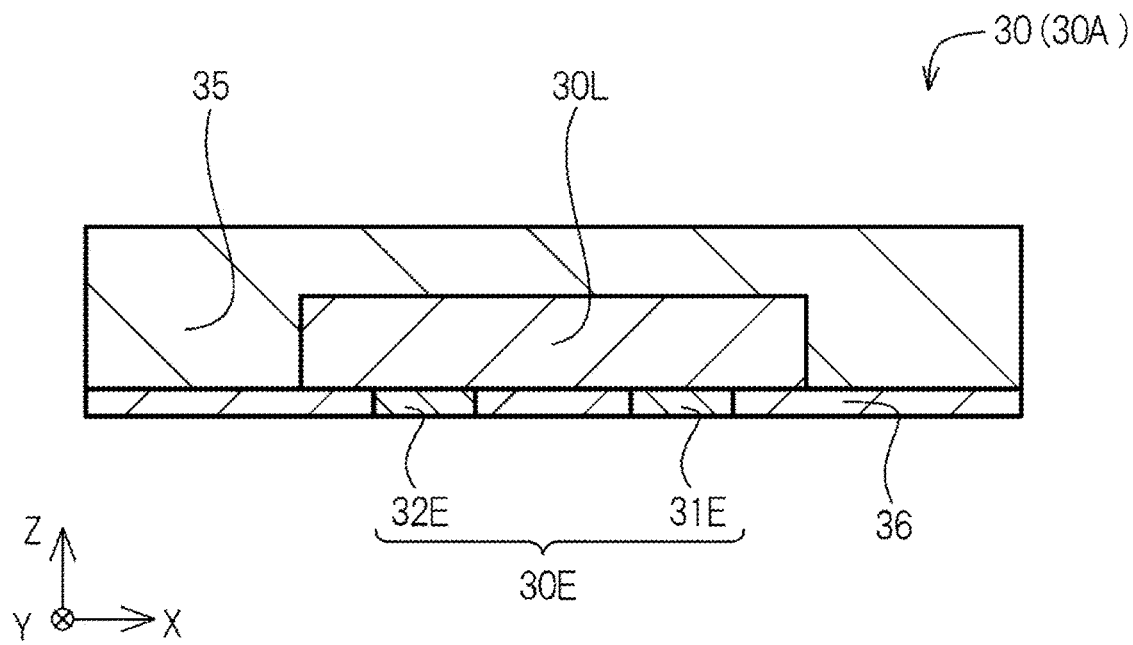
FIG. 7A is a schematic cross-sectional view of the light source according to the embodiment.

As shown in FIG. 7A, the light source 30 includes a light-emitting element 30L. The light-emitting element 30L includes a semiconductor stacked body. The semiconductor stacked body includes, for example, a substrate of sapphire, gallium nitride, or the like, an n-type semiconductor layer and a p-type semiconductor layer located on the substrate, and a light-emitting layer interposed between the n-type semiconductor layer and the p-type semiconductor layer. The light-emitting element 30L also includes an n-side electrode electrically connected with the n-type semiconductor layer, and a p-side electrode electrically connected with the p-type semiconductor layer. The n-side electrode and the p-side electrode form a portion of the lower surface of the light-emitting element 30L. The light source 30 further includes an n-side metal post electrically connected with the n-side electrode, and a p-side post electrically connected with the p-side electrode. The first electrode 31E according to the embodiment includes both the n-side electrode and the n-side metal post. The light source 30 may not include the n-side metal post. When the light source 30 does not include the n-side metal post, the first electrode 31E is formed of the n-side electrode. The second electrode 32E according to the embodiment includes both the p-side electrode and the p-side metal post. The light source 30 may not include the p-side metal post. When the light source 30 does not include the p-side metal post, the second electrode 32E is formed of the p-side electrode. The p-side metal post and the n-side metal post include, for example, copper (Cu) and/or nickel (Ni). Similarly to the first electrode 31E, the third electrode 33E according to the embodiment includes both the n-side electrode and the n-side metal post. Similarly to the second electrode 32E, the fourth electrode 34E according to the embodiment includes both the p-side electrode and the p-side metal post. The first electrode 31E may include both the p-side electrode and the p-side metal post; the second electrode 32E may include both the n-side electrode and the n-side metal post; the third electrode 33E may include both the p-side electrode and the p-side metal post; and the fourth electrode 34E may include both the n-side electrode and the n-side metal post. The light source 30 may not include a substrate of sapphire, gallium nitride, etc. As a result, it is easier to make the light source 30 smaller in the vertical direction.

The light-emitting layer may have a structure that includes a single active layer such as a double heterostructure or a single quantum well structure (SQW), or may have a structure that includes an active layer group such as a multi-quantum well structure (MQW). The light-emitting layer is configured to emit visible light or ultraviolet light. The light-emitting layer is configured to emit blue to red as the visible light. The semiconductor stacked body that includes such a light-emitting layer can include, for example, $In_xAl_yGa_{1-x-y}N$ ($0 \leq x$, $0 \leq y$, and $x+y \leq 1$). The semiconductor stacked body can include at least one light-emitting layer capable of the light emission described above. For example, the semiconductor stacked body may have a structure that includes one or more light-emitting layers between the n-type semiconductor layer and the p-type semiconductor layer, or may have a structure in which the structure including the n-type semiconductor layer, the light-emitting layer, and the p-type semiconductor layer in this order is repeated multiple times. When the semiconductor stacked body includes multiple light-emitting layers, the multiple light-emitting layers may include light-emitting layers of different peak wavelengths, or may include light-emitting layers of the same peak wavelength. The peak wavelengths being the same means that, for example, there may be fluctuation of about several nm. Such combinations of light-emitting layers can be selected as appropriate; for example, when the semiconductor stacked body includes two light-emitting layers, the light-emitting layers can be selected to have a combination of blue light and blue light, green light and green light, red light and red light, ultraviolet light and ultraviolet light, blue light and green light, blue light and red light, green light and red light, etc. The light-emitting layer may include multiple active layers of different peak wavelengths, or may include multiple active layers of the same peak wavelength.

According to the embodiment, the light-emitting element 30L includes the two semiconductor stacked bodies of a first semiconductor stacked body and a second semiconductor stacked body positioned to be separated from each other in a horizontal direction on the substrate. The n-type semiconductor layer of the first semiconductor stacked body and the first electrode 31E are electrically connected; and the p-type semiconductor layer of the first semiconductor stacked body and the second electrode 32E are electrically connected. The n-type semiconductor layer of the second semiconductor stacked body and the third electrode 33E are electrically connected; and the p-type semiconductor layer of the second semiconductor stacked body and the fourth electrode 34E are electrically connected. As shown in FIG. 5, the second electrode 32E and the third electrode 33E are electrically connected via the second wiring part 12P of the wiring substrate 10. As a result, the first semiconductor stacked body and the second semiconductor stacked body are connected in series.

The light source 30 of the embodiment includes one light-emitting element 30L. The light sources 30 of the first, second, third, and fourth light sources 30A, 30B, 30C, and 30D each may include multiple light-emitting elements 30L. The peak wavelengths of the multiple light-emitting elements included in each light source 30 may be equal or different. For example, when each light source 30 includes two light-emitting elements, the peak wavelengths of the light-emitting elements can be selected from a combination of blue light and green light, blue light and red light, ultraviolet light and blue light, ultraviolet light and green light, ultraviolet light and red light, green light and red light, etc. For example, when each light source 30 includes three light-emitting elements, the peak wavelengths of the light-emitting elements can be selected from a combination of blue light, green light, and red light, ultraviolet light, green light, and red light, ultraviolet light, blue light, and green light, ultraviolet light, blue light, and red light, ultraviolet light, green light, and red light, etc.

As shown in FIG. 7A, the light source 30 can further include a light-transmitting member (hereinbelow, called a first light source light-transmitting member 35). The first light source light-transmitting member 35 covers the upper surface and side surface of the light-emitting element 30L. The light-emitting element 30L can be protected by the first light source light-transmitting member 35. The first light source light-transmitting member 35 may be arranged to expose at least a portion of the upper surface of the light-emitting element 30L. As a result, it is easier to make the light source 30 smaller in the vertical direction.

When viewed in cross-section, the side surface of the first light source light-transmitting member 35 may be parallel to the Z-axis direction, or may be inclined with respect to the Z-axis direction. When the side surface of the first light source light-transmitting member 35 is inclined with respect to the Z-axis direction when viewed in cross-section, the side surface may be inclined so that the horizontal-direction length of the first light source light-transmitting member 35 increases downward or decreases downward when viewed in cross-section. A pair of side surfaces of the first light source light-transmitting member 35 may be inclined at the same angle with respect to the Z-axis direction when viewed in cross-section. The side surface of the first light source light-transmitting member 35 may have an unevenness when viewed in cross-section.

For example, the first light source light-transmitting member 35 is light-transmissive to the light emitted by the light-emitting element 30L. The first light source light-transmitting member 35 includes a light-transmitting resin, and may further include a fluorescer. For example, a silicone resin, an epoxy resin, etc., can be used as the light-transmitting resin. An yttrium-aluminum-garnet-based fluorescer (e.g., $(Y, Gd)_3(Al, Ga)_5O_{12}:Ce$), a lutetium-aluminum-garnet-based fluorescer (e.g., $Lu_3(Al, Ga)_5O_{12}:Ce$), a terbium-aluminum-garnet-based fluorescer (e.g., $Tb_3(Al, Ga)_5O_{12}:Ce$), a CCA-based fluorescer (e.g., $Ca_{10}(PO_4)_6Cl_2:Eu$), an SAE-based fluorescer (e.g., $Sr_4Al_{14}O_{25}:Eu$), a chlorosilicate-based fluorescer (e.g., $Ca_8MgSi_4O_{16}Cl_2:Eu$), a silicate-based fluorescer (e.g., $(Ba, Sr, Ca, Mg)_2SiO_4:Eu$), an oxynitride-based fluorescer such as a β-sialon-based fluorescer (e.g., $(Si, Al)_3(O, N)_4:Eu$), an α-sialon-based fluorescer (e.g., $Ca(Si, Al)_{12}(O, N)_{16}:Eu$), or the like, a nitride-based fluorescer such as an LSN-based fluorescer (e.g., $(La, Y)_3Si_6N_{11}:Ce$), a BSESN-based fluorescer (e.g., $(Ba, Sr)_2Si_5N_8:Eu$), an SLA-based fluorescer (e.g., $SrLiAl_3N_4:Eu$), a CASN-based fluorescer (e.g., $CaAlSiN_3:Eu$), a SCASN-based fluorescer (e.g., $(Sr, Ca)AlSiN_3:Eu$), or the like, a fluoride-based fluorescer such as a KSF-based fluorescer (e.g., $K_2SiF_6:Mn$), a KSAF-based fluorescer (e.g., $K_2(Si_{1-x}Al_x)F_{6-x}:Mn$, wherein x satisfies 0<x<1), a MGF-based fluorescer (e.g., $3.5MgO\cdot0.5MgF_2\cdot GeO_2:Mn$), or the like, a quantum dot having a perovskite structure (e.g., $(Cs, FA, MA)(Pb, Sn)(F, Cl, Br, I)_3$, wherein FA and MA are respectively formamidinium and methylammonium), a Group II-VI quantum dot (e.g., CdSe), a Group III-V quantum dot (e.g., InP), a quantum dot having a chalcopyrite structure (e.g., $(Ag, Cu)(In, Ga)(S, Se)_2$), etc., can be used as the fluorescer. The fluorescer that is added to the first light source light-transmitting member 35 may be one type of fluorescer, or may be multiple types of fluorescers.

A wavelength conversion sheet that includes the fluorescer described above may be located at the upper side of the light-emitting device 1000. The wavelength conversion sheet can be a planar light source that emits white light by absorbing a portion of blue light from the light source 30 and emitting yellow light, green light, and/or red light. For example, white light can be obtained by combining the light source 30 capable of a blue light emission and a wavelength conversion sheet including a fluorescer capable of a yellow light emission. Also, the light source 30 capable of a blue light emission and a wavelength conversion sheet including a red fluorescer and a green fluorescer may be combined. The light source 30 that is capable of a blue light emission and multiple wavelength conversion sheets may be combined. For example, a wavelength conversion sheet including a fluorescer capable of a red light emission and a wavelength conversion sheet including a fluorescer capable of a green light emission can be selected as the multiple wavelength conversion sheets. A light source 30 including the light-emitting element 30L capable of a blue light emission, the first light source light-transmitting member 35 including a fluorescer capable of a red light emission, and a wavelength conversion sheet including a fluorescer capable of a green light emission may be combined.

For example, it is favorable to use the yttrium-aluminum-garnet-based fluorescer described above as a fluorescer capable of a yellow light emission included in the wavelength conversion sheet. For example, it is favorable to use the quantum dot having the perovskite structure, the Group III-V quantum dot, or the quantum dot having the chalcopyrite structure described above, which have narrow light emission peak wavelength widths at half maximum, as a fluorescer capable of a green light emission included in the wavelength conversion sheet. For example, it is favorable to use the KSF-based fluorescer, the KSAF-based fluorescer, the Group III-V quantum dot, or the quantum dot having the chalcopyrite structure described above, which have narrow light emission peak wavelength widths at half maximum similarly to the fluorescer capable of a green light emission, as a fluorescer capable of a red light emission included in the wavelength conversion sheet.

A band-pass filter that transmits light in a specific wavelength region and reflects light in the other wavelength regions may be located between the wavelength conversion sheet and the light source 30. For example, a dichroic sheet is used as the band-pass filter. It is favorable for the band-pass filter to transmit only blue light and to reflect light of other colors (green light and red light). As a result, only blue light among the light from the light source 30 can be incident on the wavelength conversion sheet; therefore, by combining with a wavelength conversion sheet that absorbs a portion of the blue light from the light source 30 and emits white light, the white light is easily emitted by the wavelength conversion sheet. Light other than blue light (e.g., green light, red light, etc.) can be prevented from being transmitted by the band-pass filter, being reflected by the wavelength conversion sheet, and returning to the light source 30 side. As a result, the uneven luminance of the light-emitting device 1000 is reduced.

A diffusion sheet may be located between the band-pass filter and the light source 30. The diffusion sheet can transmit the light from the light source 30 and diffuse the transmitted light when the light is emitted from the diffusion sheet toward the band-pass filter side. As a result, uneven luminance of the light-emitting device 1000 can be reduced. It is favorable for the diffusion sheet to include a material having low absorptivity for the light emitted by the light-emitting element 30L. Examples of the diffusion sheet include polycarbonate, polystyrene, acrylic, polyethylene, etc. The diffusion sheet may include a micro unevenness in the emission surface, and may include a light-diffusing optical film. The diffusion sheet may include a single layer, or may include a stacked body of multiple layers.

A prism sheet may be arranged to face the surface of the wavelength conversion sheet at the side opposite to the light source 30. Multiple prisms that extend in one direction are arranged at the surface of the prism sheet. The prism sheet may include one prism sheet or multiple overlapping prism sheets. For example, when multiple overlapping prism sheets are used, one of the multiple prism sheets can be a prism extending in the X-direction; and another one of the multiple prism sheets can be a prism extending in the Y-direction. As a result, the light that is emitted from the prism sheet can be along a direction orthogonal to the emission surface of the prism sheet; and the luminance of the light-emitting device 1000 when viewed in top-view can be increased.

The light source 30 can further include a covering member 36. The covering member 36 is reflective to the light emitted by the light-emitting element 30L. The covering member 36 is located at the lower surface of the light-emitting element 30L. The covering member 36 is arranged so that the lower surface of the electrode 30E of the light source 30 is not covered with the covering member 36. The covering member 36 also is located at the lower surface of the first light source light-transmitting member 35 covering the side surface of the light-emitting element 30L.

According to the embodiment, the resin part 40R and the covering member 36 contact each other. It is favorable for the covering member 36 to include a resin member as a base material. By including a resin member in the covering member 36, the thermal expansion coefficients of the covering member 36 and the resin part 40R easily approach each other. The adhesion between the covering member 36 and the resin part 40R is easily improved thereby. The covering member 36 can include, for example, a resin member that includes a gas such as nitrogen and/or oxygen or the like, a resin member that includes light-scattering particles, etc. For example, a material similar to the resin member of the reflecting member 20 can be used as the resin member of the covering member 36. For example, a material similar to that of the light-scattering particles of the reflecting member 20 can be used as the light-scattering particles of the resin member of the covering member 36. The covering member 36 may include both a gas and light-scattering particles.

Figure 7B:
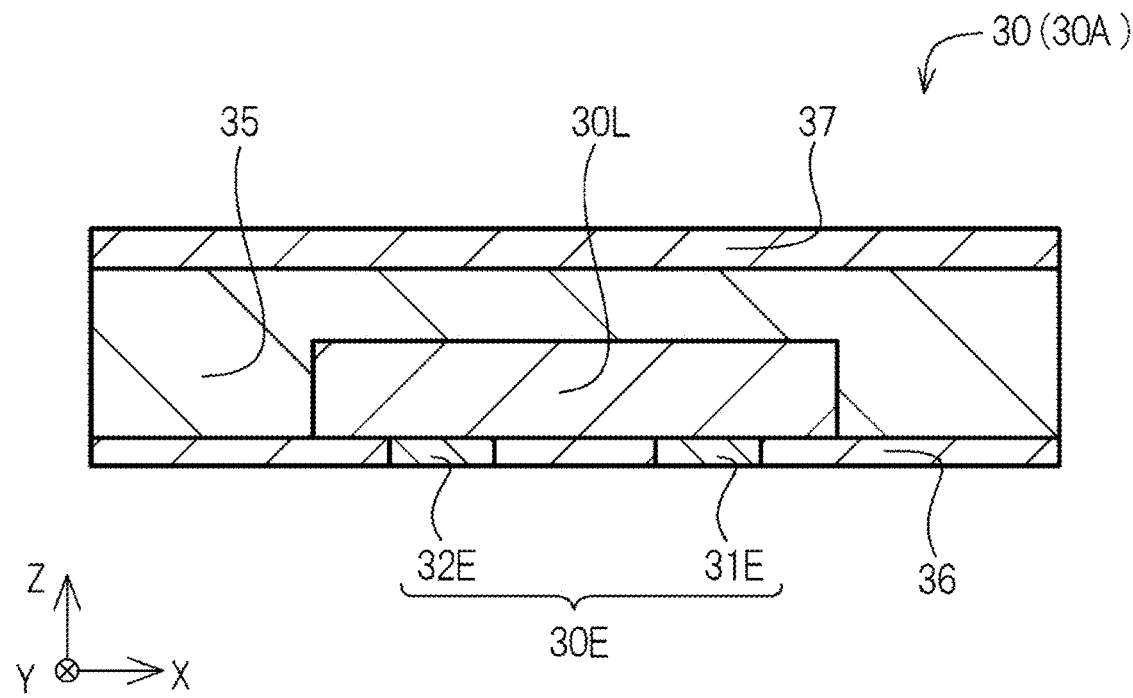
FIG. 7B is a schematic cross-sectional view of a modification of the light source according to the embodiment.

As shown in FIG. 7B, the light source 30 can include a light-modulating member (hereinbelow, called a light source light-modulating member 37). The light source light-modulating member 37 forms at least a portion of the upper surface of the light source 30. The light source light-modulating member 37 is positioned at the upper side of the light-emitting element 30L. When viewed in top-view, the light source light-modulating member 37 and the light-emitting element 30L overlap; and the light source light-modulating member 37 is positioned at the upper side of the light-emitting element 30L at the overlapping portion. The light source light-modulating member 37 is positioned at the upper side of the first light source light-transmitting member 35, and modulates the amount and/or emission direction of the light emitted from the upper surface of the first light source light-transmitting member 35. The light source light-modulating member 37 is reflective and light-transmissive to the light emitted by the light-emitting element 30L. A portion of the light emitted from the upper surface of the first light source light-transmitting member 35 is reflected by the light source light-modulating member 37; and another portion is transmitted by the light source light-modulating member 37. It is favorable for the transmittance of the light source light-modulating member 37 for the peak wavelength of the light-emitting element 30L to be, for example, not less than 1% and not more than 50%, and more favorably not less than 3% and not more than 30%. By including the light source light-modulating member 37 in the light source 30, the region directly above the light source 30 can be prevented from being too bright. Uneven luminance of the light-emitting device 1000 is more easily reduced thereby.

The light source light-modulating member 37 can include, for example, a resin member that includes a gas such as nitrogen and/or oxygen or the like, a resin member that includes light-scattering particles, etc. A material similar to that of the resin member of the reflecting member 20 can be used as the resin member of the light source light-modulating member 37. A material similar to that of the light-scattering particles of the reflecting member 20 can be used as the light-scattering particles of the light source light-modulating member 37. The light source light-modulating member 37 may include both a gas and light-scattering particles. The light source light-modulating member 37 may be, for example, a metal member of aluminum, silver, etc., or a dielectric multilayer film.

As shown in FIG. 7A, the light source 30 may not include the light source light-modulating member 37. That is, the upper surface of the light source 30 may be formed of the upper surface of the light-emitting element 30L and/or the upper surface of the first light source light-transmitting member 35. As a result, it is easier to make the light source 30 smaller in the vertical direction than when the light source 30 includes the light source light-modulating member 37 positioned at the upper side of the light-emitting element 30L. As another configuration of the light source 30, the light source 30 may not include the covering member 36. That is, the lower surface of the light source 30 may be formed of the lower surface of the light-emitting element 30L and the lower surface of the first light source light-transmitting member 35. As another configuration of the light source 30, the light source 30 may be only the light-emitting element 30L alone. As another configuration of the light source 30, the light source 30 may not include the first light source light-transmitting member 35 and the covering member 36; and the light source light-modulating member 37 may be positioned at the upper surface of the light-emitting element 30L. As another configuration of the light source 30, the light source 30 may not include the first light source light-transmitting member 35; the light source light-modulating member 37 may be positioned at the upper surface of the light-emitting element 30L; and the covering member 36 may be positioned at the lower surface of the light-emitting element 30L.

Figure 7C:
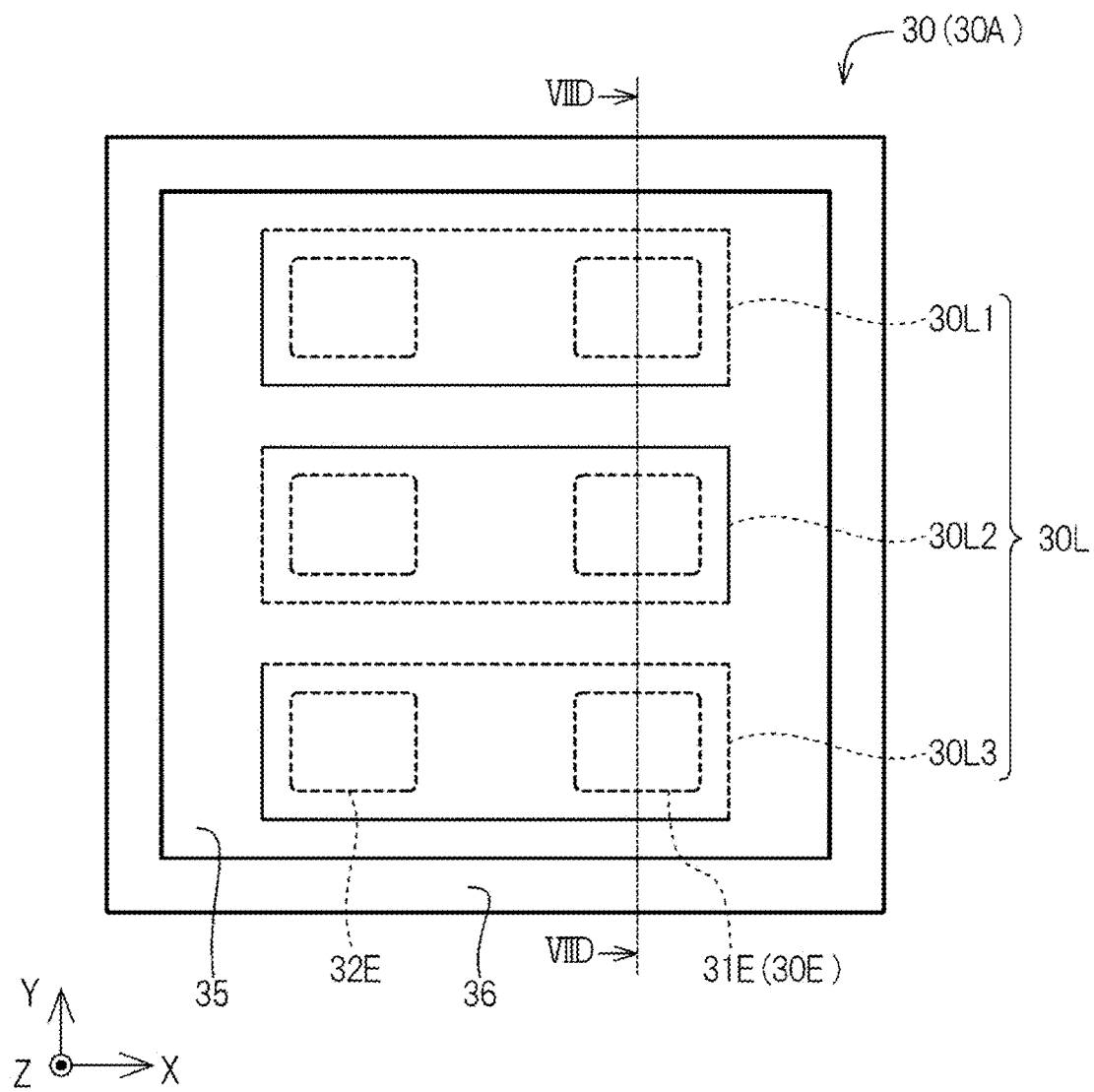
FIG. 7C is a schematic top view of a modification of the light source according to the embodiment.
Figure 7D:
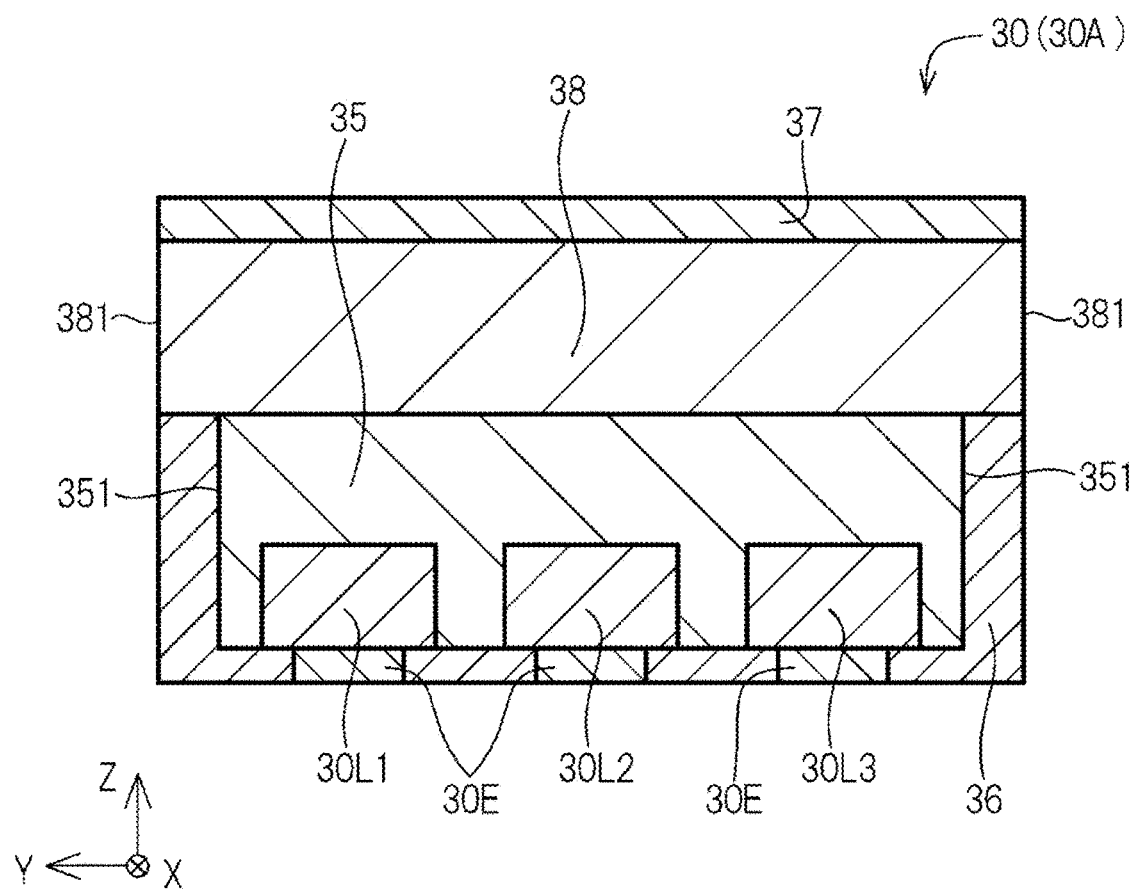
FIG. 7D is a schematic cross-sectional view of the light source along line VIID-VIID of FIG. 7C.
Figure 8:
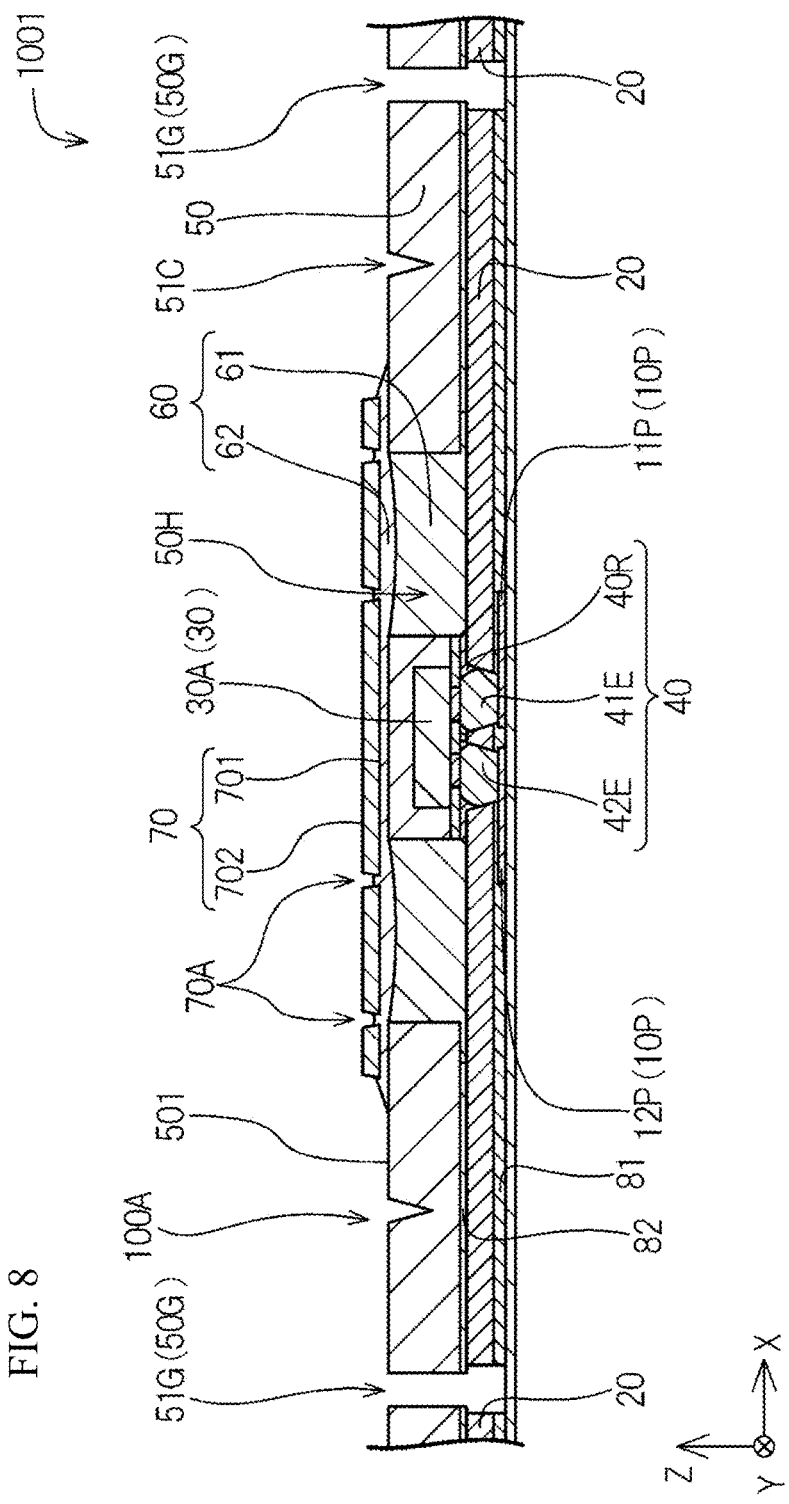
FIG. 8 is a schematic cross-sectional view of a modification of the light-emitting device according to the embodiment.

As shown in FIGS. 7C and 7D, the light source 30 may include multiple light-emitting elements 30L. The multiple light-emitting elements 30L include a first light-emitting element 30L1, a second light-emitting element 30L2, and a third light-emitting element 30L3. The peak wavelength of the first light-emitting element 30L1, the peak wavelength of the second light-emitting element 30L2, and the peak wavelength of the third light-emitting element 30L3 are not particularly limited. For example, the peak wavelength of the first light-emitting element 30L1, the peak wavelength of the second light-emitting element 30L2, and the peak wavelength of the third light-emitting element 30L3 may be equal or different. It is favorable for the peak wavelength of the first light-emitting element 30L1 to be not less than 430 nm and not more than 480 nm, the light emission peak wavelength of the second light-emitting element 30L2 to be not less than 500 nm and not more than 580 nm, and the light emission peak wavelength of the third light-emitting element 30L3 to be not less than 430 nm and not more than 480 nm. By including the first and third light-emitting elements 30L1 and 30L3 that emit blue light and the second light-emitting element 30L2 that emits green light in the light source 30, color reproducibility is more easily improved when the light-emitting device is used in a liquid crystal display device. Color reproducibility is more easily improved by using a light-emitting element emitting green light than when green light is obtained using a green fluorescer because the width at half maximum of the green light is more easily reduced.

As shown in FIG. 7C, it is favorable to position the second light-emitting element 30L2 that emits green light between the first light-emitting element 30L1 and the third light-emitting element 30L3 that emit blue light. The blue light and the green light are more easily mixed thereby.

As shown in FIG. 7D, it is favorable for at least a portion of an outer surface 351 of the first light source light-transmitting member 35 covering the side surfaces of the first, second, and third light-emitting elements 30L1, 30L2, and 30L3 to be covered with the covering member 36. As a result, the light from the first light-emitting element 30L1, the light from the second light-emitting element 30L2, and the light from the third light-emitting element 30L3 is easily mixed inside the first light source light-transmitting member 35. Color mixing of the light source 30 is more easily improved thereby. It is favorable for the first light source light-transmitting member 35 covering the side surfaces of the first, second, and third light-emitting elements 30L1, 30L2, and 30L3 to include a fluorescer capable of a red light emission. As a result, the light source 30 can emit blue light, green light, and red light. According to the embodiment, the covering member 36 that covers at least a portion of the outer surface 351 of the first light source light-transmitting member 35 and the covering member 36 located at the lower surface of the light-emitting element 30L are formed to have a continuous body of the same material. The covering member 36 that covers at least a portion of the outer surface 351 of the first light source light-transmitting member 35 and the covering member 36 located at the lower surface of the light-emitting element 30L may be separate bodies. At least a portion of the outer surface 351 of the first light source light-transmitting member 35 covering the side surfaces of the first, second, and third light-emitting elements 30L1, 30L2, and 30L3 may not be covered with the covering member 36. The light from the first light-emitting element 30L1, the light from the second light-emitting element 30L2, and the light from the third light-emitting element 30L3 are more easily extracted thereby.

As shown in FIG. 7D, the light source 30 can further include a light-transmitting member (hereinbelow, called a second light source light-transmitting member 38) between the first light source light-transmitting member 35 and the light source light-modulating member 37 in the vertical direction. At least a portion of an outer surface 381 of the second light source light-transmitting member 38 is not covered with the covering member 36. As a result, the light from the first light-emitting element 30L1, the light from the second light-emitting element 30L2, and the light from the third light-emitting element 30L3 can be extracted from the outer surface 381 of the second light source light-transmitting member 38. The light source light-modulating member 37 and the second light source light-transmitting member 38 are not illustrated in FIG. 7C.

The shape of the light source 30 when viewed in top-view is not particularly limited. The shape of the light source 30 when viewed in top-view can be, for example, a shape such as circular, triangular, quadrilateral, hexagonal, octagonal, etc. When the shape of the light source 30 when viewed in top-view is quadrilateral, a pair of outer edges of the light source 30 may be parallel to the X-direction or tilted with respect to the X-direction. According to the embodiment, the pair of outer edges of the light source 30 is parallel to the X-direction.

Bonding Member 40

The bonding member 40 electrically connects the wiring substrate 10 and the light source 30. As shown in FIGS. 3 and 4, the bonding member 40 includes a conductive part 40E that is conductive, and the resin part 40R that is insulative. For example, known materials such as tin-bismuth, tin-copper, tin-silver, gold-tin, and other solder, conductive paste of silver, gold, palladium, or the like, a bump, an anisotropic conductive material, brazing material of a low melting-point metal, etc., can be used as the material of the conductive part 40E of the bonding member 40. For example, a material similar to that of the resin member of the reflecting member 20 can be used as the material of the base material of the resin part 40R of the bonding member 40. The resin part 40R of the bonding member 40 may include light-scattering particles similar to those of the reflecting member 20. It is favorable for the resin part 40R of the bonding member 40 to be adhesive. By the adhesive resin part 40R contacting the reflecting member 20 and the light source 30, the bonding strength between the reflecting member 20 and the light source 30 is easily increased. For example, a known material such as a rosin-based resin, a terpene resin, a petroleum resin, a styrene resin, a phenolic resin, a xylene resin, an acrylic resin, etc., can be used as the material of the adhesive resin part 40R. A conductive paste such as solder or the like in which metal particles and flux are mixed may be used as the bonding member 40 before curing. The metal particles are melted by heating to a temperature not less than the melting point of the metal particles; subsequently, the conductive part 40E can be formed by curing the melted metal particles by cooling. The resin part 40R can be formed of the flux included in the conductive paste.

As shown in FIG. 5, the conductive parts 40E according to the embodiment include a first conductive part 41E, a second conductive part 42E, a third conductive part 43E, and a fourth conductive part 44E. The bonding member 40 includes the first conductive part 41E that contacts the resin part 40R. The first conductive part 41E electrically connects the first wiring part 11P of the wiring substrate 10 and the first electrode 31E of the light source 30. The first conductive part 41E is positioned in the first through-hole 21H of the reflecting member 20. The resin part 40R contacts the first inclined surface 21A of the reflecting member 20 and the light source 30. By including the resin part 40R that contacts the reflecting member 20 and the light source 30 in the light-emitting device 1000, the bonding strength between the light source 30 and the reflecting member 20 is easily increased.

Because the first inclined surface 21A spreads upward, the contact area between the resin part 40R and the first inclined surface 21A is more easily increased than when the inner surface of the reflecting member 20 defining the first through-hole 21H is not inclined with respect to the Z-axis direction. The bonding strength between the resin part 40R and the reflecting member 20 is easily increased thereby. Also, because the first inclined surface 21A spreads upward, it is easier for voids occurring in the resin part 40R to move outside the resin part 40R than when the first inclined surface 21A spreads downward. As a result, the bonding strength between the resin part 40R and the reflecting member 20 is easily increased because the contact area between the resin part 40R and the first inclined surface 21A is more easily increased.

The second conductive part 42E electrically connects the second wiring part 12P of the wiring substrate 10 and the second electrode 32E of the light source 30. The third conductive part 43E electrically connects the second wiring part 12P of the wiring substrate 10 and the third electrode 33E of the light source 30. The fourth conductive part 44E electrically connects the third wiring part 13P of the wiring substrate 10 and the fourth electrode 34E of the light source 30. The second conductive part 42E is positioned in the second through-hole 22H of the reflecting member 20. The third conductive part 43E is positioned in the third through-hole 23H of the reflecting member 20. The fourth conductive part 44E is positioned in the fourth through-hole 24H of the reflecting member 20.

As shown in FIGS. 3 and 4, it is favorable for one resin part 40R to contact the first and second conductive parts 41E and 42E. The contact area between the resin part 40R and the light source 30 and/or the contact area between the resin part 40R and the reflecting member 20 is more easily increased thereby. The bonding strength between the light source 30 and the reflecting member 20 is easily increased thereby. It is favorable for one resin part 40R to contact the first, second, third, and fourth conductive parts 41E, 42E, 43E, and 44E. The contact area between the resin part 40R and the light source 30 and/or the contact area between the resin part 40R and the reflecting member 20 is more easily increased thereby. The light-emitting device may include multiple resin parts 40R that respectively contact the multiple conductive parts 40E and are positioned to be separated from each other.

It is favorable for the resin part 40R to contact the second inclined surface 22A and the light source 30. The bonding strength between the light source 30 and the reflecting member 20 is easily increased thereby. It is favorable for the resin part 40R to contact the third inclined surface 23A and the light source 30. The bonding strength between the light source 30 and the reflecting member 20 is easily increased thereby. It is favorable for the resin part 40R to contact the fourth inclined surface 24A and the light source 30. The bonding strength between the light source 30 and the reflecting member 20 is easily increased thereby. It is favorable for one resin part 40R to contact the first and second inclined surfaces 21A and 22A. As a result, the bonding strength between the resin part 40R and the reflecting member 20 is easily increased because the contact area between the resin part 40R and the reflecting member 20 is more easily increased. It is favorable for one resin part 40R to contact the first, second, third, and fourth inclined surfaces 21A, 22A, 23A, and 24A.

As shown in FIG. 6, it is favorable for a portion of the resin part 40R to be positioned outside the light source 30 in a top view. The contact area between the resin part 40R and the light source 30 and/or the contact area between the resin part 40R and the reflecting member 20 is more easily increased thereby. The bonding strength between the light source 30 and the reflecting member 20 is easily increased thereby.

As shown in FIG. 6, it is favorable for a portion of the first electrode 31E to overlap the first inclined surface 21A when viewed in top-view. The area of the first electrode 31E when viewed in top-view is more easily increased thereby. As a result, heat dissipation of the light-emitting device 1000 is easily improved because the heat from the light source 30 is easily conducted to the wiring substrate 10 via the first electrode 31E. It is favorable for a portion of the second electrode 32E to overlap the second inclined surface 22A when viewed in top-view. It is favorable for a portion of the third electrode 33E to overlap the third inclined surface 23A when viewed in top-view. It is favorable for a portion of the fourth electrode 34E to overlap the fourth inclined surface 24A when viewed in top-view.

When viewed in top-view, it is favorable for the length from the center of a portion of the first through-hole 21H that is open at the lower surface of the reflecting member to the center of a portion of the second through-hole 22H that is open at the lower surface of the reflecting member to be greater than the length from the center of the first electrode 31E to the center of the second electrode 32E. The distance from the first through-hole 21H to the second through-hole 22H is more easily increased thereby. As a result, it is easier to prevent the first through-hole 21H and the second through-hole 22H from connecting. Similarly, when viewed in top-view, it is favorable for the length from the center of a portion of the first through-hole 21H that is open at the lower surface of the reflecting member to the center of a portion of the third through-hole 23H that is open at the lower surface of the reflecting member to be greater than the length from the center of the first electrode 31E to the center of the third electrode 33E. When viewed in top-view, it is favorable for the length from the center of a portion of the first through-hole 21H that is open at the lower surface of the reflecting member to the center of a portion of the fourth through-hole 24H that is open at the lower surface of the reflecting member to be greater than the length from the center of the first electrode 31E to the center of the fourth electrode 34E. In the specification, the center of a member means the geometric centroid of the member.

It is favorable for the first conductive part 41E to contact the first inclined surface 21A. The volume of the first conductive part 41E is more easily increased thereby. As a result, heat dissipation of the light-emitting device 1000 is easily improved because the heat from the light source 30 is easily conducted to the wiring substrate 10 via the first conductive part 41E. The first conductive part 41E may not contact the first inclined surface 21A. The contact area between the first inclined surface 21A and the resin part 40R is more easily increased thereby. The bonding strength between the reflecting member 20 and the resin part 40R is easily increased thereby.

A cross section that passes through the first and second electrodes 31E and 32E in a direction perpendicular to the upper surface 10A of the wiring substrate 10 is taken as a first cross section. In the first cross section as shown in FIG. 4, the first inclined surface 21A includes a first-incline first surface 21A1 positioned at the second electrode 32E side, and a first-incline second surface 21A2 facing the first-incline first surface 21A1. The perpendicular-direction length of a portion of the resin part 40R contacting the first-incline first surface 21A1 is taken as a first length L1. The perpendicular-direction length of a portion of the resin part 40R contacting the first-incline second surface 21A2 is taken as a second length L2. It is favorable for the second length L2 to be greater than the first length L1. The contact area between the resin part 40R and the first-incline second surface 21A2 is more easily increased thereby. As a result, the bonding strength between the resin part 40R and the reflecting member 20 is easily increased at the outer perimeter vicinity of the light source 30 where the resin part 40R and the reflecting member 20 undesirably separate easily due to warp of the wiring substrate 10 due to the heat from the light source 30, etc.

In the first cross section as shown in FIG. 4, the minimum length from the upper end of a portion of the first conductive part 41E contacting the first inclined surface 21A to the upper end of a portion of the second conductive part 42E contacting the second inclined surface 22A is taken as a third length L3. The minimum length in the first cross section from the first wiring part 11P to the second wiring part 12P is taken as a fourth length L4. It is favorable for the third length L3 to be less than the fourth length L4. The volume of the first conductive part 41E and/or the second conductive part 42E is more easily increased thereby. As a result, heat dissipation of the light-emitting device 1000 is easily improved because the heat from the light source 30 is easily conducted to the wiring substrate 10 via the first conductive part 41E and/or the second conductive part 42E.

It is favorable for the refractive index of the base material of the resin part 40R to be greater than the refractive index of the base material of the reflecting member 20. As a result, the light that is emitted from the light source 30 and travels downward is totally reflected more easily at the interface between the resin part 40R and the reflecting member 20. As a result, the light extraction efficiency of the light-emitting device 1000 is easily increased because the light of the light-emitting device 1000 that escapes downward is more easily reduced. Although not particularly limited in the specification, the refractive index is taken to be the value for the peak wavelength of the light source. For example, the refractive index can be measured with an Abbe refractometer. When the measurement cannot be performed with an Abbe refractometer due to the size of the member, etc., the refractive index can be determined by identifying the member and then using the measurement result of a member similar to the identified member.

Figure 9:
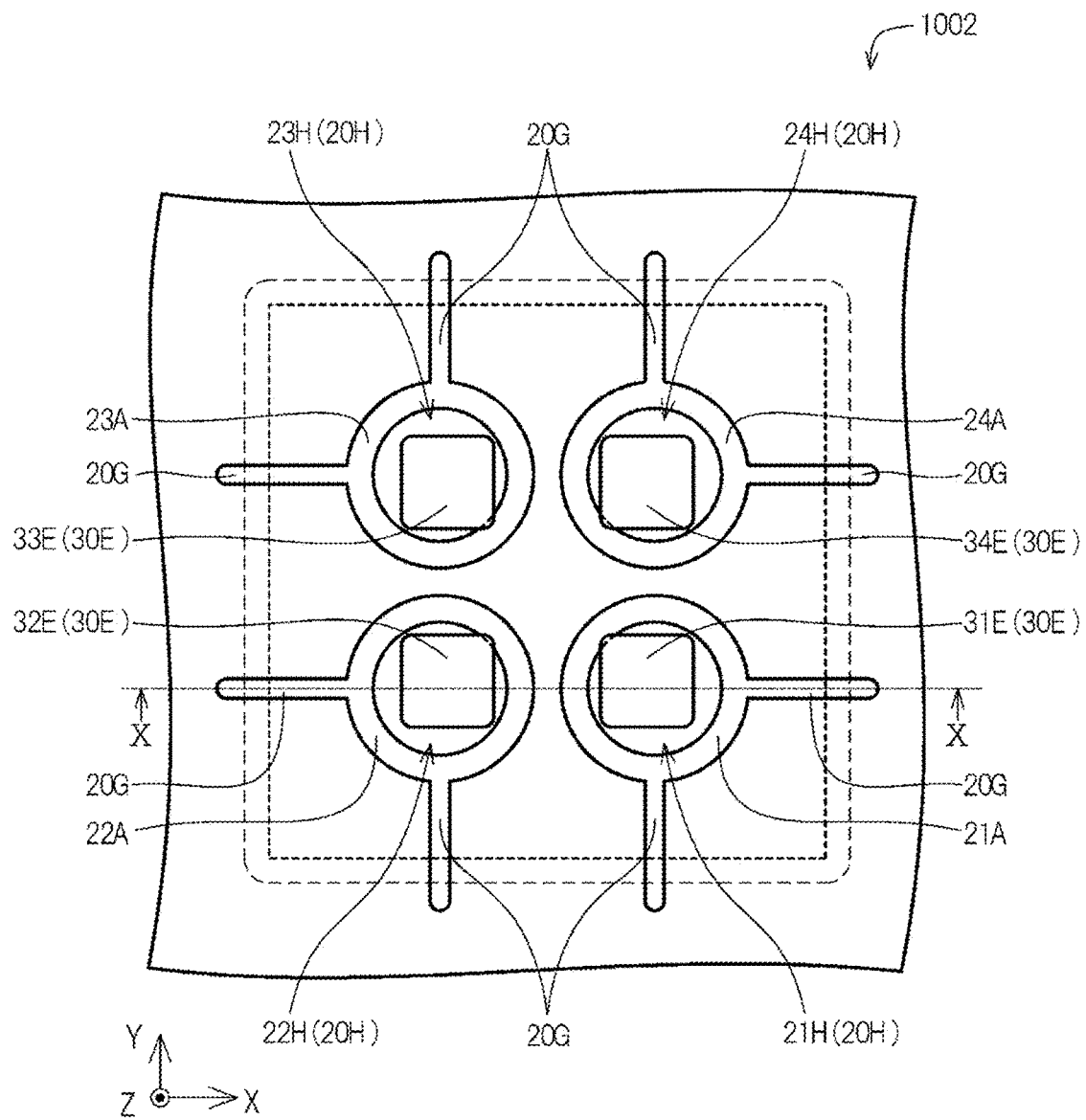
FIG. 9 is a schematic top view of a modification of the electrodes and the reflecting member of the light source.
Figure 10:
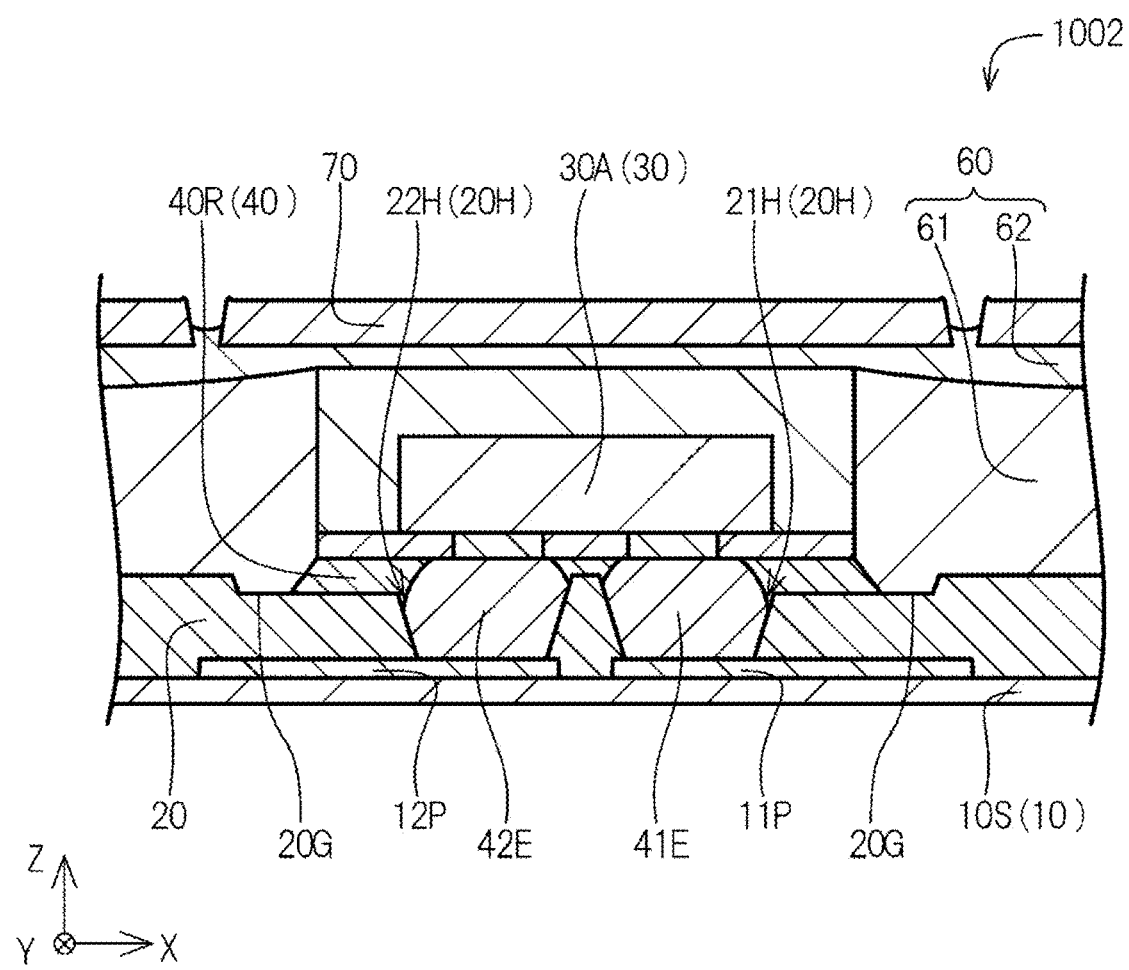
FIG. 10 is a schematic cross-sectional view of the light-emitting device along line X-X of FIG. 9.

As in a light-emitting device 1002 shown in FIGS. 9 and 10, it is favorable for the reflecting member 20 to include a recess (hereinbelow, called a reflecting recess 20G) that is connected with the reflecting through-hole 20H at the upper surface. As a result, the voids that occur in the reflecting through-hole 20H are more easily moved outside the reflecting through-hole 20H via the reflecting recess 20G. As a result, the voids positioned in the reflecting through-hole 20H are more easily reduced, and so the volume of the bonding member 40 positioned in the reflecting through-hole 20H is easily increased. As a result, the bonding strength between the wiring substrate 10 and the light source 30 is more easily increased. The number of the reflecting recesses 20G connected with one reflecting through-hole 20H in the reflecting member 20 is not particularly limited. It is favorable for the reflecting member 20 to include multiple reflecting recesses 20G connected with one reflecting through-hole 20H. As a result, the voids that occur in the reflecting through-hole 20H are more easily moved outside the reflecting through-hole 20H via the multiple reflecting recesses 20G. It is favorable for the reflecting recess 20G to extend outside the light source 30 when viewed in top-view. As a result, the voids that occur between the reflecting member 20 and the light source 30 are more easily moved outside the light source 30 when viewed in top-view.

Figure 11:
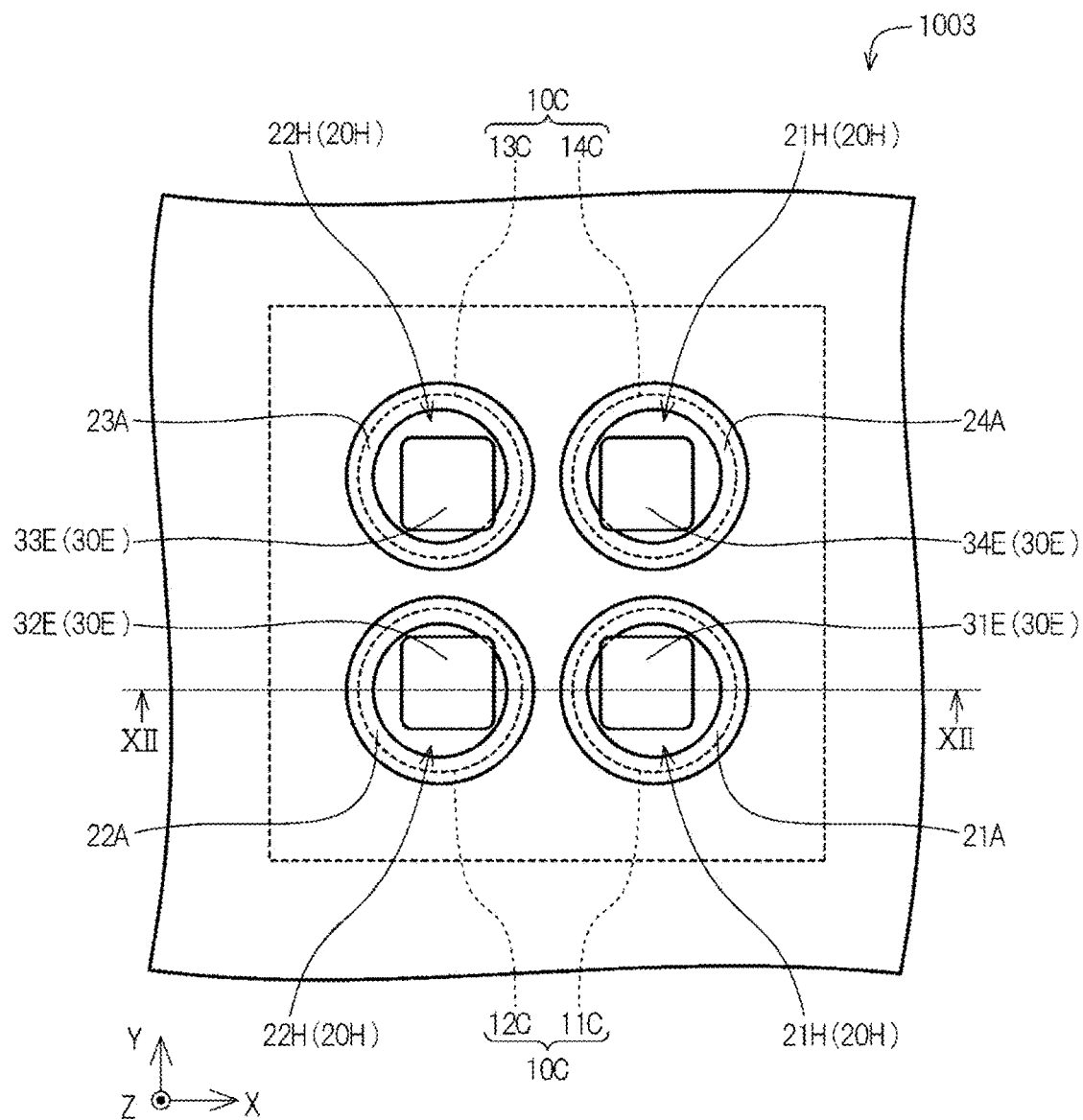
FIG. 11 is a schematic top view of a modification of the electrodes and the reflecting member of the light source.
Figure 12:
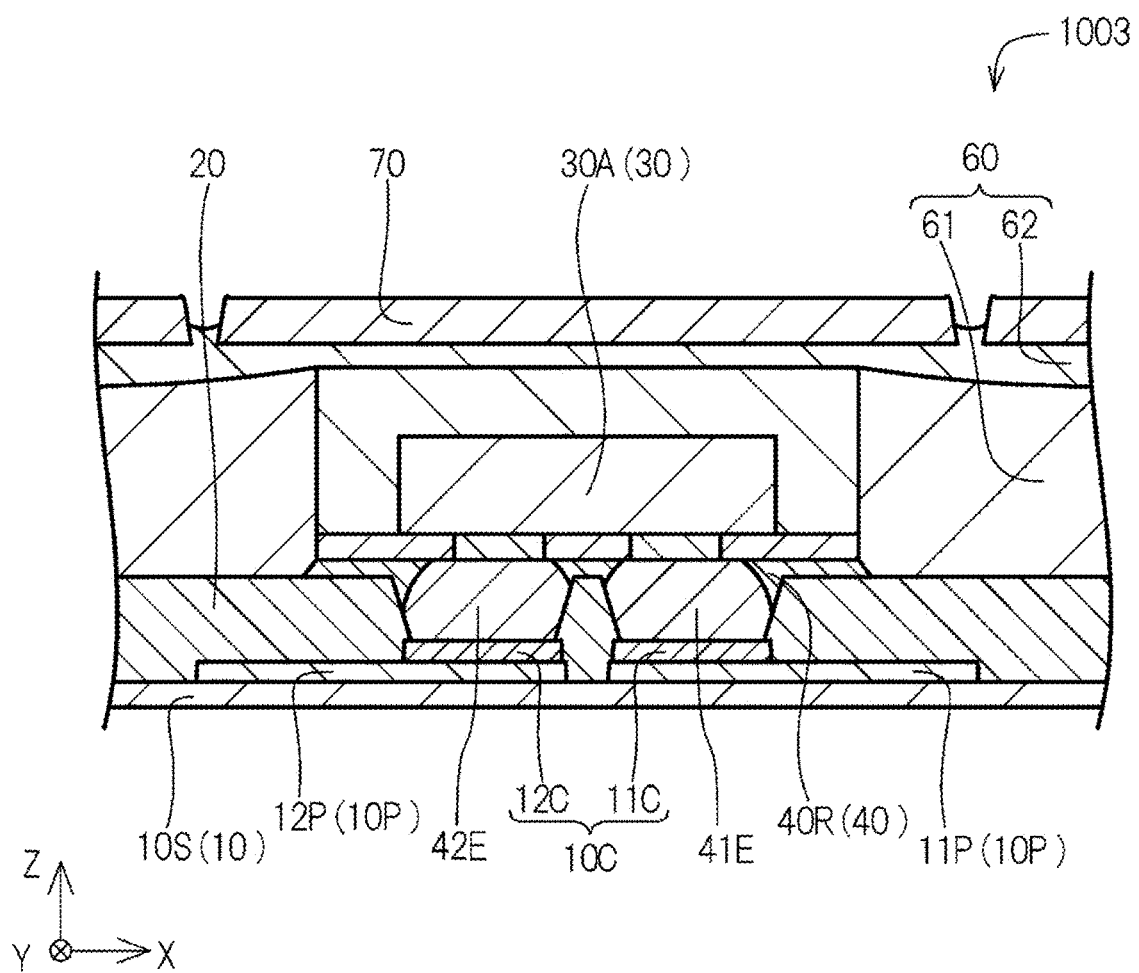
FIG. 12 is a schematic cross-sectional view of the light-emitting device along line XII-XII of FIG. 11.
Figure 13:
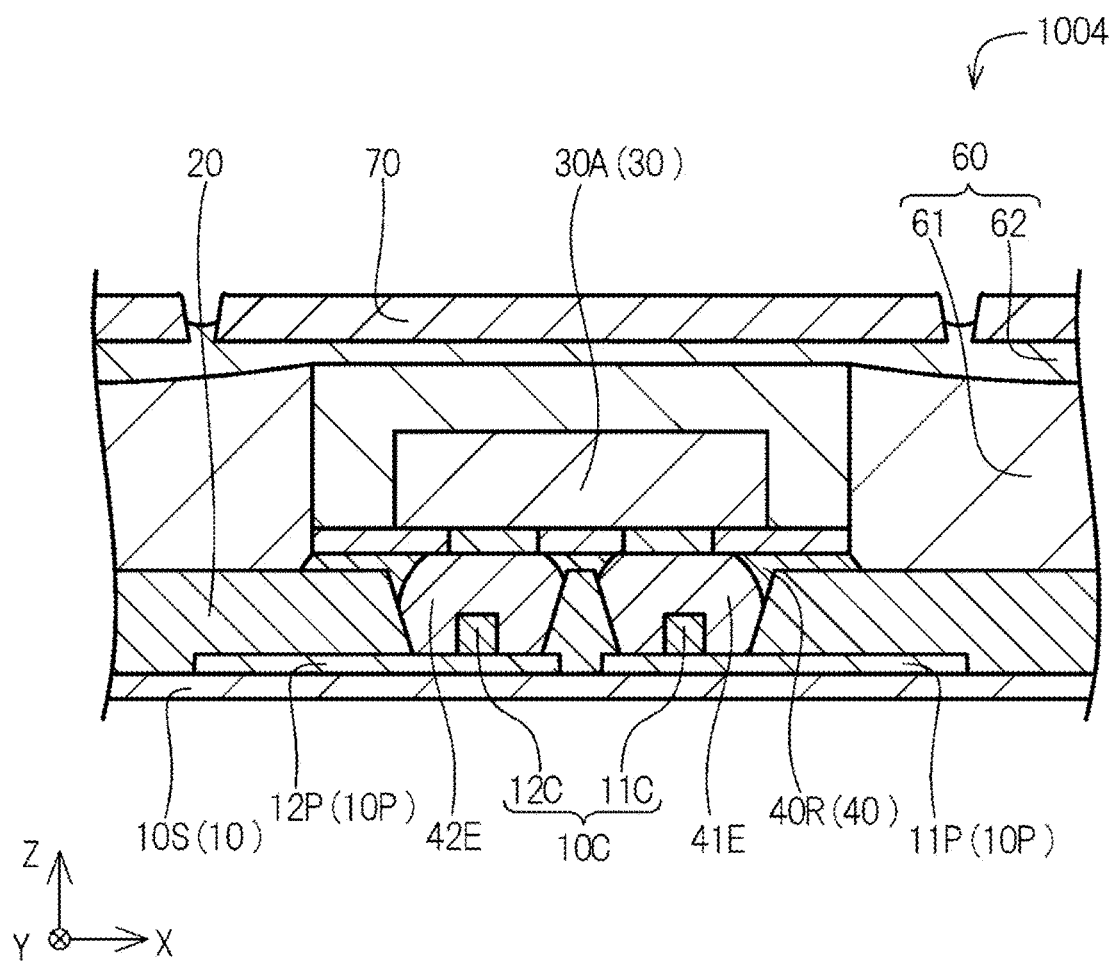
FIG. 13 is a schematic cross-sectional view of a modification of the light-emitting device according to the embodiment.

As in a light-emitting device 1003 shown in FIG. 12, conductive connecting members 10C that contact the wiring parts 10P and the bonding members 40 may be included. As shown in FIG. 12, the connecting members 10C of the embodiment include a first connecting part 11C contacting the first wiring part 11P and the first conductive part 41E, and a second connecting part 12C contacting the second wiring part 12P and the second conductive part 42E. The connecting members 10C may include a third connecting part contacting the second wiring part 12P and the third conductive part 43E, and a fourth connecting part contacting the third wiring part 13P and the fourth conductive part 44E. At least a portion of the connecting member 10C is positioned inside the reflecting through-hole 20H when viewed in top-view. As shown in FIG. 11, it is favorable for the first connecting part 11C to be positioned inside the first through-hole 21H and outside the first through-hole 21H. The volume of the first connecting part 11C is more easily increased thereby. As a result, heat dissipation of the light-emitting device 1003 is easily improved because the heat from the light source 30 is easily conducted to the wiring substrate 10 via the first connecting part 11C. It is favorable for the second connecting part 12C to be positioned inside the second through-hole 22H and outside the second through-hole 22H. It is favorable for the maximum length of the first connecting part 11C in the vertical direction to be greater than the maximum length of the first wiring part 11P in the vertical direction. As a result, the volume of the first connecting part 11C is more easily increased as in a light-emitting device 1004 shown in FIG. 13. The first connecting part 11C may be positioned only inside the first through-hole 21H. The volume of the first conductive part 41E is more easily reduced by positioning the first connecting part 11C in the first through-hole 21H. The shape fluctuation of the first conductive part 41E is more easily reduced thereby. For example, a material similar to that of the conductive part 40E of the bonding member 40 or a material similar to that of the wiring part 10P can be used as the material of the connecting member 10C. It is favorable for the thermal conductivity of the connecting member 10C to be greater than the thermal conductivity of the conductive part 40E. As a result, the heat from the light source 30 is easily conducted to the wiring substrate 10 via the connecting member 10C.

As shown in FIG. 3, the light-emitting device 1000 includes a light guide member 50. The light guide member 50 is light-transmissive to the light emitted by the light source 30. It is favorable for the transmittance of the light guide member 50 for the peak wavelength of the light source 30 to be, for example, not less than 60%, and more favorably not less than 80%. The light guide member 50 includes a first surface 501 used as the light-emitting surface of the light-emitting device 1000, and a second surface 502 positioned at the side opposite to the first surface 501. The light guide member 50 includes a through-hole (hereinbelow, called a light guide through-hole 50H) extending from the first surface 501 to the second surface 502. The light source 30 is positioned at the light guide through-hole 50H of the light guide member 50. As a result, the light guide member 50 surrounds the light source 30 when viewed in top-view. According to the embodiment, the light guide through-hole 50H is circular when viewed in top-view. The light guide through-hole 50H may be elliptic or polygonal such as triangular, quadrilateral, hexagonal, octagonal, etc., when viewed in top-view.

For example, a material similar to that of the resin member of the reflecting member 20 can be used as the material of the light guide member 50. Glass, etc., may be used as the material of the light guide member 50. The light guide member 50 may include a fluorescer and/or light-scattering particles.

The light guide member 50 is positioned at the upper side of the reflecting member 20. According to the embodiment, the reflecting member 20 and the light guide member 50 are fixed by a second adhesive layer 82 located between the reflecting member 20 and the light guide member 50. The second adhesive layer 82 can include, for example, a resin member that includes light-scattering particles. For example, a material similar to that of the resin member of the reflecting member 20 can be used as the resin member of the second adhesive layer 82. For example, a material similar to that of the light-scattering particles of the reflecting member 20 can be used as the light-scattering particles of the second adhesive layer 82. A sheet-like optically clear adhesive may be used as the second adhesive layer 82. The reflecting member 20 and the light guide member 50 may be directly bonded without including the second adhesive layer 82.

It is favorable for the refractive index of the base material of the second adhesive layer 82 to be less than the refractive index of the base material of the light guide member 50. As a result, a portion of the light traveling from the light guide member 50 to the second adhesive layer 82 is totally reflected more easily at the interface between the light guide member 50 and the second adhesive layer 82. As a result, the light extraction efficiency of the light-emitting device 1000 is increased because the light of the light-emitting device 1000 that escapes downward can be reduced.

The number of the light guide members 50 included in the light-emitting device 1000 may be one or multiple. According to the embodiment, the light-emitting device 1000 includes the multiple light guide members 50 including a first light guide part 50A, a second light guide part 50B, a third light guide part 50C, and a fourth light guide part 50D. As shown in FIG. 1, the first light guide part 50A and the second light guide part 50B are adjacent to each other in the X-direction. The third light guide part 50C and the fourth light guide part 50D are adjacent to each other in the X-direction. The first light guide part 50A and the third light guide part 50C are adjacent to each other in the Y-direction. The second light guide part 50B and the fourth light guide part 50D are adjacent to each other in the Y-direction. The first light source 30A is positioned in the light guide through-hole 50H of the first light guide part 50A. The second light source 30B is positioned in the light guide through-hole 50H of the second light guide part 50B. The third light source 30C is positioned in the light guide through-hole 50H of the third light guide part 50C. The fourth light source 30D is positioned in the light guide through-hole 50H of the fourth light guide part 50D.

The light guide member 50 is partitioned by a partitioning trench 50G. One region partitioned by the partitioning trench 50G is taken as a light-emitting region 100A. According to the embodiment, the first light guide part 50A, the second light guide part 50B, the third light guide part 50C, and the fourth light guide part 50D partitioned by the partitioning trench 50G are different light-emitting regions 100A. One light-emitting region 100A can be used as the driving unit of local dimming. The number of the light-emitting regions 100A included in the light-emitting device 1000 is not particularly limited. For example, the light-emitting device 1000 may include one light-emitting region 100A, or the light-emitting device 1000 may include multiple light-emitting regions 100A. A planar light source device having a larger area may be formed by arranging the multiple light-emitting devices 1000. A member that is reflective to the light emitted by the light source 30 may be located in the partitioning trench 50G. The contrast between the light-emitting region in the light-emitting state and the light-emitting region in the non-light-emitting state can be improved thereby. In the light-emitting module, a member that is reflective to the light emitted by the light source 30 may not be located in the partitioning trench 50G.

According to the embodiment, the light guide member 50 includes the partitioning trench 50G having a lattice shape including first partitioning trenches 51G extending in the Y-direction and second partitioning trenches 52G extending in the X-direction. The first partitioning trench 51G that extends in the Y-direction is between the first light guide part 50A and the second light guide part 50B. The second partitioning trench 52G that extends in the X-direction is between the first light guide part 50A and the third light guide part 50C. It is favorable for the partitioning trench 50G to extend from the first surface 501 to the second surface 502 of the light guide member 50. As a result, the light guide member 50 can be separated into a plurality, and so, for example, warp of the light guide member 50 and/or the wiring substrate 10 due to the thermal expansion coefficient difference between the light guide member 50 and the wiring substrate 10 is more easily reduced. The partitioning trench 50G may be a recess open only at the first surface 501 side of the light guide member 50, or may be a recess open at only the second surface 502 side of the light guide member 50. When the partitioning trench 50G is a recess, the partitioning trench 50G includes a bottom surface formed of the light guide member 50.

The side surface of the partitioning trench 50G may be parallel to the Z-axis direction, or may be inclined with respect to the Z-axis direction. When the side surface of the partitioning trench 50G is inclined with respect to the Z-axis direction, the distance of the side surfaces of the partitioning trench 50G that face each other may increase or decrease downward.

As shown in FIG. 1, it is favorable for the partitioning trench 50G to expose the reflecting member 20 when viewed in top-view. As a result, the luminance at the vicinity of the partitioning trench 50G is more easily prevented from becoming too low. The luminance at the vicinity of the partitioning trench 50G may be modulated by appropriately modulating the vertical-direction length of the reflecting member 20 positioned inside the partitioning trench 50G when viewed in top-view. As in the light-emitting device 1001 shown in FIG. 8, the reflecting member 20 may be separated into a plurality for each light-emitting region 100A. Warp of the wiring substrate 10 and/or the reflecting member 20 due to the thermal expansion coefficient difference between the wiring substrate 10 and the reflecting member 20 is more easily reduced thereby.

As shown in FIG. 3, it is favorable for the light guide member 50 to include a hole part (hereinbelow, called a light guide hole part 51C) open at the first surface 501 and/or the second surface 502 of the light guide member 50. The light guide hole part 51C is positioned between the light guide through-hole 50H and the partitioning trench 50G when viewed in top-view. According to the embodiment, the light guide hole part 51C is a recess that is open only at the first surface 501 side. The light guide hole part 51C may be a recess that is open only at the second surface 502 side, or a through-hole extending from the first surface 501 to the second surface 502 of the light guide member 50. By including the light guide hole part 51C in the light guide member 50, the surface area of the light guide member 50 can be increased. The amount of the light extracted outside the light guide member 50 from the surface of the light guide member 50 can be increased thereby. As a result, uneven luminance of the light-emitting device 1000 is more easily reduced because the modulation of the luminance of the light-emitting device 1000 is easier. The depth of the recess in the vertical direction is, for example, not less than 0.1 times the maximum length of the light guide member 50 in the vertical direction. The light guide member 50 may include one, two, or more light guide hole parts 51C.

The shape of the light guide hole part 51C when viewed in top-view is not particularly limited. As shown in FIG. 1, the shape of the light guide hole part 51C according to the embodiment is circular when viewed in top-view. The light guide hole part 51C may include a linear portion when viewed in top-view. In the specification, linear includes straight lines, curves, bent lines, etc. The shape of the light guide hole part 51C when viewed in top-view may be a V-shape or an L-shape extending in two directions. The shape of the light guide hole part 51C when viewed in top-view may be elliptical or polygonal such as triangular, quadrilateral, hexagonal, octagonal, etc.

In the specification, points of the outer edge of the first light guide part 50A that are positioned at the first surface 501 and are most distant from the center of the first light source 30A are called first points P1; and points of the outer edge of the first light guide part 50A that are positioned at the first surface 501 and are most proximate to the center of the first light source 30A are called second points P2. According to the embodiment, the first points P1 are positioned at the corners of the first light guide part 50A; and the second points P2 are positioned at the centers of the sides of the first light guide part 50A. One or a plurality of each of the first and second points P1 and P2 may be included.

Figure 2:
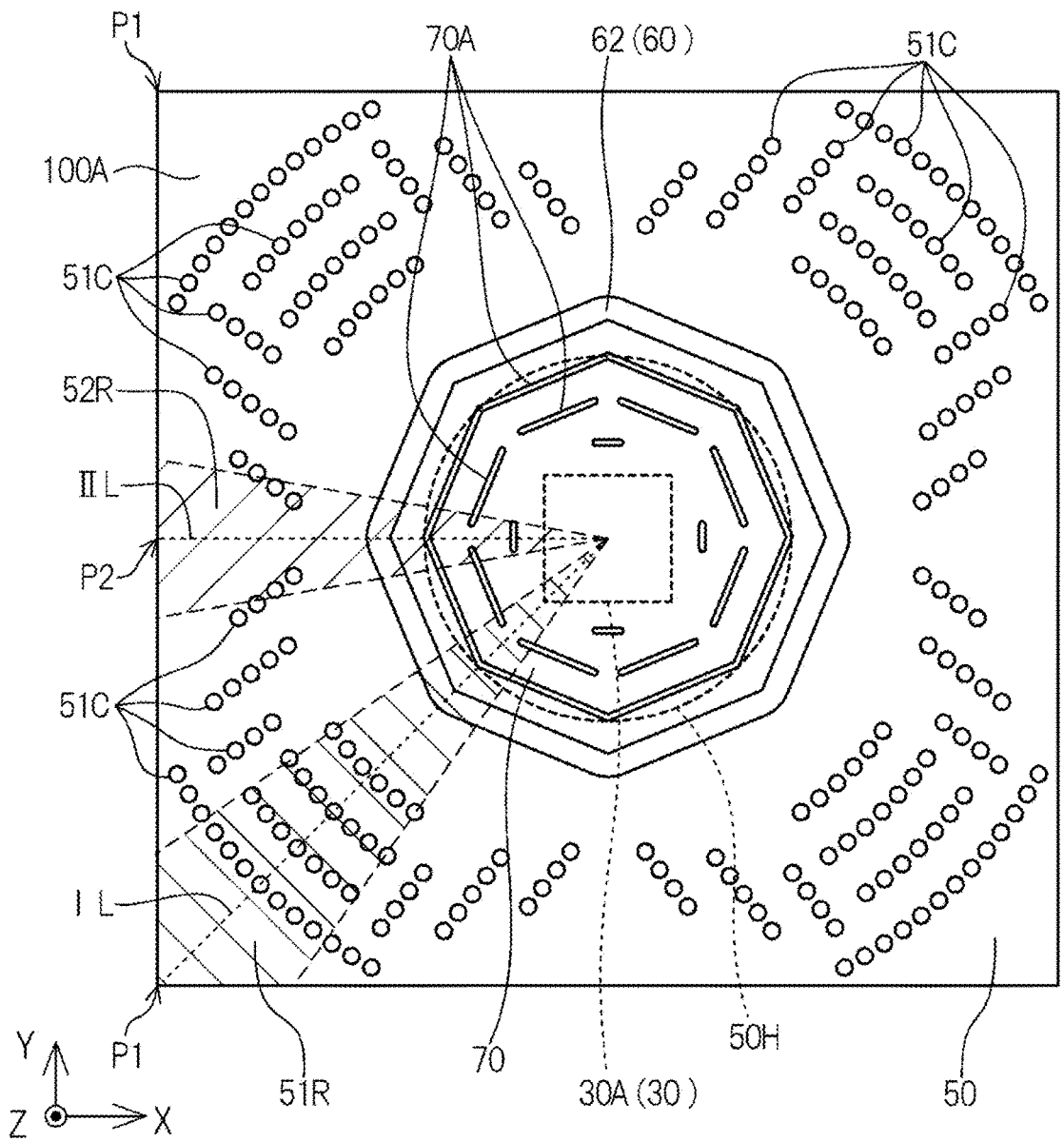
FIG. 2 is a schematic top view of a light-emitting region of the light-emitting device according to the embodiment.

As shown in FIG. 2, a first virtual straight line IL connects the first point P1 and the center of the first light source 30A when viewed in top-view. A second virtual straight line IIL connects the second point P2 and the center of the first light source 30A when viewed in top-view. An area of the first surface 501 that passes through the center of the first light source 30A and is within angles of 10° from the first virtual straight line IL is taken as a first region 51R. An area of the first surface 501 that passes through the center of the first light source 30A and is within angles of 10° from the second virtual straight line IIL is taken as a second region 52R. In FIG. 2, the area positioned in the first region 51R is illustrated by right-ascending hatching; and the area positioned in the second region 52R is illustrated by left-ascending hatching. It is favorable for the density of the light guide hole parts 51C in the first region 51R to be greater than the density of the light guide hole parts 51C in the second region 52R. The luminance at the first point P1 distant to the first light source 30A tends to be less than the luminance at the second point P2 proximate to the first light source 30A, but the amount of the light extracted outside from the light guide member 50 at the vicinity of the first point P1 is more easily increased by increasing the density of the light guide hole parts 51C in the first region 51R. As a result, uneven luminance of the light-emitting device 1000 is more easily reduced because the difference between the luminance at the first point P1 and the luminance at the second point P2 can be reduced. The density of the light guide hole parts 51C in the first region 51R is the ratio of the area of the light guide hole parts 51C positioned in the first region 51R in the area of the first region 51R when viewed in top-view. When multiple light guide hole parts 51C are positioned in the first region 51R, the density of the light guide hole parts 51C in the first region 51R is the ratio of the total area of the light guide hole parts 51C positioned in the first region 51R to the area of the first region 51R when viewed in top-view.

The shape of the light guide hole part 51C located in the first light guide part 50A and the shape of the light guide hole part 51C located in the second light guide part 50B may be the same or different. Also, the number of the light guide hole parts 51C located in the first light guide part 50A and the number of the light guide hole parts 51C located in the second light guide part 50B may be the same or different. For example, the uneven luminance of the first light guide part 50A and the uneven luminance of the second light guide part 50B are checked before forming the light guide hole parts 51C in the light guide member 50. After checking the uneven luminance of the first light guide part 50A and the uneven luminance of the second light guide part 50B, the light guide hole parts 51C that are suited to the first and second light guide parts 50A and 50B are formed in the light guide member 50. Uneven luminance of the light-emitting device 1000 can be reduced thereby. For example, if the uneven luminance before forming the light guide hole parts 51C in the light guide member 50 is suppressed within a desired range, the light guide hole parts 51C may not be provided in the light guide member 50. Examples of methods for checking the uneven luminance of the first light guide part 50A and the uneven luminance of the second light guide part 50B include, for example, checking by measuring the luminance with a two-dimensional color luminance meter (Konica Minolta CA-2500).

It is favorable for the maximum length of the light guide member 50 in the vertical direction to be, for example, not less than 150 μm and not more than 800 μm. The light guide member 50 may include a single layer in the vertical direction, or may include a stacked body of multiple layers. When the light guide member 50 includes a stacked body, a light-transmitting adhesive may be located between the layers. The layers of the stacked body may include different types of major materials.

The method for forming the light guide hole part 51C in the light guide member 50 is not particularly limited. For example, the light guide hole part 51C can be formed in the light guide member 50 by a known method such as laser patterning, drilling, etc. A light guide member that includes the light guide hole part 51C may be formed by a method using a die assembly or the like such as injection molding, transfer molding, compression molding, etc.

Light-Transmitting Member 60

As shown in FIG. 3, the light-emitting device 1000 includes a light-transmitting member 60. The light-transmitting member 60 is light-transmissive to the light emitted by the light source 30. The light-transmitting member 60 covers the light source 30.

The light-transmitting member 60 of the embodiment includes a first light-transmitting part 61 and a second light-transmitting part 62. According to the embodiment, the first light-transmitting part 61 and the second light-transmitting part 62 are separate bodies. The first light-transmitting part 61 and the second light-transmitting part 62 may be formed to have a continuous body from the same material. It is favorable for the transmittances of the first and second light-transmitting parts 61 and 62 for the peak wavelength of the light source 30 each to be, for example, not less than 60%, and more favorably not less than 80%. It is favorable for the transmittances of the first and second light-transmitting parts 61 and 62 for the peak wavelength of the light source 30 each to be greater than the transmittance of the resin part 40R for the peak wavelength of the light source 30. The light extraction efficiency of the light-emitting device 1000 is easily increased thereby.

As shown in FIG. 3, it is favorable for the first light-transmitting part 61 to contact the side surface of the light source 30. As a result, the light from the light source 30 is more easily incident on the first light-transmitting part 61. It is favorable for the first light-transmitting part 61 to contact the light guide member 50. As a result, the light from the light source 30 is more easily incident on the light guide member 50.

It is favorable for the entire upper surface of the light source 30 not to be covered with the first light-transmitting part 61. As a result, it is easier to make the light-emitting device 1000 smaller in the vertical direction. The first light-transmitting part 61 may cover the entire upper surface of the light source 30, or may cover a portion of the light source 30. The modulation of the luminance in the region directly above the light source 30 is easier when the first light-transmitting part 61 covers the entire upper surface of the light source 30. For example, the luminance in the region directly above the light source 30 can be modulated by modifying the thickness of the portion of the first light-transmitting part 61 covering the upper surface of the light source 30. As a result, uneven luminance of the light-emitting device 1000 is easily reduced because it is easier to modulate the luminance. When the first light-transmitting part 61 covers the upper surface of the light source 30, the second light-transmitting part 62 may cover the upper surface of the light source 30 with the first light-transmitting part 61 interposed, or may not cover the upper surface of the light source 30.

It is favorable for the first light-transmitting part 61 of the light-transmitting member 60 to contact the second surface 502, which is the lower surface of the light guide member 50 as shown in FIG. 3. The bonding strength between the light-transmitting member 60 and the light guide member 50 is easily increased thereby. It is favorable for the first light-transmitting part 61 of the light-transmitting member 60 to continuously contact the second surface 502 of the light guide member 50 and the inner surface of the light guide member 50 defining the light guide through-hole 50H. The bonding strength between the light-transmitting member 60 and the light guide member 50 is easily increased thereby.

The first light-transmitting part 61 may include a single layer in the vertical direction, or may include a stacked body of multiple layers. The first light-transmitting part 61 may include a fluorescer and/or light-scattering particles. When the first light-transmitting part 61 is a stacked body, the layers may or may not include a fluorescer and/or light-scattering particles. For example, the first light-transmitting part 61 may include a layer that includes a fluorescer, and a layer that does not include a fluorescer. For example, a material similar to that of the resin member of the reflecting member 20 can be used as the material of the first light-transmitting part 61.

The second light-transmitting part 62 of the embodiment is positioned at the upper side of the light source 30. The second light-transmitting part 62 is positioned at the upper side of the first light-transmitting part 61. It is favorable for the second light-transmitting part 62 to contact the upper surface of the light source 30 and/or the upper surface of the first light-transmitting part 61. As a result, it is easier to make the light-emitting device 1000 smaller in the vertical direction.

The second light-transmitting part 62 according to the embodiment is positioned between the light source 30 and a light-modulating member 70, which is described below. As a result, the second light-transmitting part 62 can fix the light source 30 and the light-modulating member 70. By positioning the second light-transmitting part 62 between the light guide member 50 and the light-modulating member 70, the light that is emitted from the light guide member 50 is more easily incident on the light-modulating member 70 via the second light-transmitting part 62.

For example, a material similar to that of the resin member of the reflecting member 20 can be used as the material of the second light-transmitting part 62. A sheet-like optically clear adhesive (OCA) or hot-melt resin may be used as the material of the second light-transmitting part 62. The second light-transmitting part 62 may include a fluorescer and/or light-scattering particles.

Figure 14:
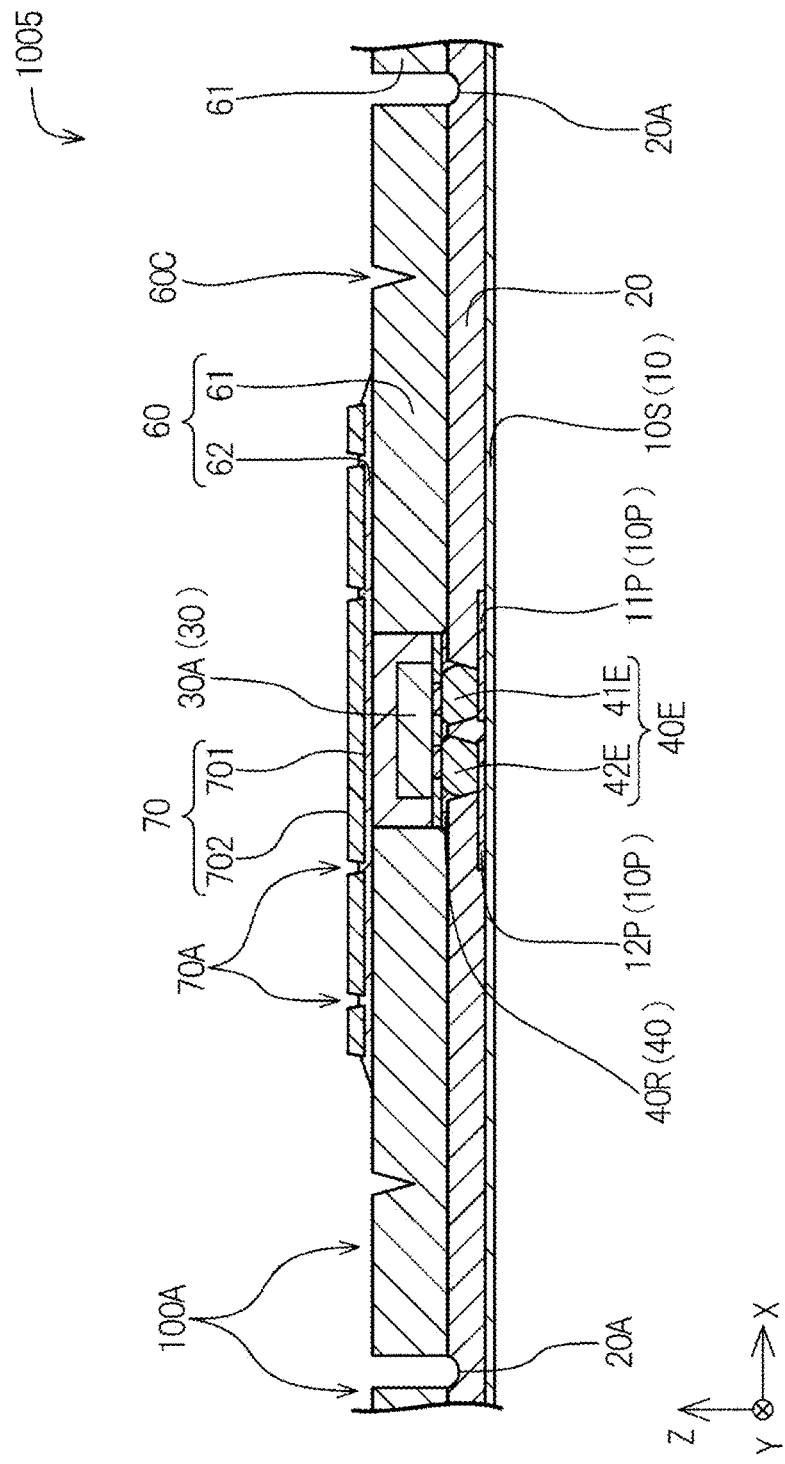
FIG. 14 is a schematic cross-sectional view of a modification of the light-emitting device according to the embodiment.

As in a light-emitting device 1005 shown in FIG. 14, the light guide member 50 may not be included. In the light-emitting device 1005, the light-emitting region 100A is partitioned by the outer edge of the first light-transmitting part 61. It is favorable for the first light-transmitting part 61 to include a hole part (hereinbelow, called a light-transmitting hole part 60C) that is open at the upper surface and/or the lower surface. According to the embodiment, the light-transmitting hole part 60C is a recess that is open only at the upper surface side of the first light-transmitting part 61. The light-transmitting hole part 60C may be a recess that is open only at the lower surface side of the first light-transmitting part 61, or may be a through-hole extending from the upper surface to the lower surface of the first light-transmitting part 61. By including the light-transmitting hole part 60C in the first light-transmitting part 61, the surface area of the first light-transmitting part 61 can be increased. The amount of the light extracted outside the first light-transmitting part 61 from the surface of the first light-transmitting part 61 can be increased thereby. As a result, uneven luminance of the light-emitting device 1005 is more easily reduced because it is easier to modulate the luminance of the light-emitting device 1005.

It is favorable for the reflecting member 20 not to be covered with the first light-transmitting part 61 between the multiple first light-transmitting parts 61 as shown in FIG. 14. As a result, the luminance at the vicinity of the region between the multiple first light-transmitting parts 61 is more easily prevented from becoming too low. The vertical-direction length of the reflecting member 20 not covered with the first light-transmitting part 61 between the multiple first light-transmitting parts 61 may be appropriately adjusted. For example, the reflecting member 20 may include a recess 20A and/or a protrusion at the upper surface.

By positioning the recess 20A of the reflecting member 20 between the multiple first light-transmitting parts 61, the luminance at the vicinity of the region between the multiple first light-transmitting parts 61 is more easily prevented from becoming too bright. By positioning a protrusion of the reflecting member 20 between the multiple first light-transmitting parts 61, the luminance of the vicinity of the region between the multiple first light-transmitting parts 61 is more easily prevented from becoming too dark. The reflecting member 20 may be separated into a plurality for each light-emitting region 100A. Warp of the wiring substrate 10 and/or the reflecting member 20 due to the thermal expansion coefficient difference between the wiring substrate 10 and the reflecting member 20 is more easily reduced thereby.

Light-Modulating Member 70

As shown in FIG. 3, the light-emitting device 1000 includes the light-modulating member 70. The light-modulating member 70 is reflective and light-transmissive to the light emitted by the light source 30. A portion of the light emitted from the light source 30 reflected by the light-modulating member 70; and another portion of light is transmitted by the light-modulating member 70. The transmittance of the light-modulating member 70 for the peak wavelength of the light source 30 is less than the transmittance of the light guide member 50 for the peak wavelength of the light source 30. It is favorable for the transmittance of the light-modulating member 70 for the peak wavelength of the light source 30 to be, for example, not less than 1% and not more than 50%, and more favorably not less than 3% and not more than 30%. The light-modulating member 70 may include a single layer, or may include a stacked body of multiple layers.

As shown in FIG. 3, the light-modulating member 70 according to the embodiment is positioned at the upper side of the light source 30. The light source 30 and a portion of the light-modulating member 70 overlap when viewed in top-view; and the light-modulating member 70 is positioned at the upper side of the light source 30 at the overlapping portion. By positioning the light-modulating member 70 at the upper side of the light source 30, the region directly above the light source 30 is more easily prevented from become too bright.

As shown in FIG. 2, it is favorable for at least a portion of the outer edge of the light-modulating member 70 to be positioned outside the outer edge of the light guide through-hole 50H of the light guide member 50 when viewed in top-view. As a result, the vicinity of the outer edge of the light guide through-hole 50H can be prevented from becoming too bright. The entire outer edge of the light-modulating member 70 may be positioned outside the outer edge of the light guide through-hole 50H when viewed in top-view. As a result, the vicinity of the outer edge of the light guide through-hole 50H also can be prevented from becoming too bright.

The light-modulating member 70 includes a third surface 701 facing the upper surface of the light source 30, and a fourth surface 702 positioned at the side opposite to the third surface 701. It is favorable for the light-modulating member 70 to include a hole part (hereinbelow, called a light-modulating hole part 70A) that is open at the third surface 701 and/or the fourth surface 702. According to the embodiment, the light-modulating hole part 70A is a through-hole that extends from the third surface 701 to the fourth surface 702. The light-modulating hole part 70A may be a recess that is open at only the third surface 701 side, or the light-modulating hole part 70A may be a recess that is open at only the fourth surface 702 side. By including the light-modulating hole part 70A in the light-modulating member 70, it is easier to modulate the luminance in the region directly above the light-modulating member 70. For example, by modifying the size and/or position of the light-modulating hole part 70A, the light from the light source 30 that is shielded by the light-modulating member 70 is more easily modulated. As a result, uneven luminance of the light-emitting device 1000 is easily reduced because it is easier to modulate the luminance in the region directly above the light-modulating member 70.

It is favorable for the light-modulating hole part 70A of the light-modulating member 70 to be at a position separated from the light source 30 when viewed in top-view. As a result, the region directly above the light source 30 is more easily prevented from becoming too bright. The shape of the light-modulating hole part 70A when viewed in top-view is not particularly limited. As shown in FIG. 2, the shape of the light-modulating hole part 70A when viewed in top-view may include a linear portion. The shape of the light-modulating hole part 70A when viewed in top-view may be circular or polygonal such as elliptical, triangular, quadrilateral, hexagonal, octagonal, etc.

It is favorable for the multiple light-modulating hole parts 70A to surround the light source 30 when viewed in top-view. The luminance of the light-emitting device 1000 in the X-direction and/or the Y-direction is more easily modulated thereby. The light-modulating hole part 70A may surround the light source 30 without breaks when viewed in top-view. The luminance of the light-emitting device 1000 in the X-direction and/or the Y-direction is more easily modulated thereby.

The light-modulating member 70 can include a resin member, and a reflector included in the resin member. For example, a material similar to that of the resin member of the reflecting member 20 can be used as the resin member of the light-modulating member 70. A material similar to that of the light-scattering particles of the reflecting member 20 can be used as the material of the reflector of the light-modulating member 70. A gas such as nitrogen, oxygen, etc., may be used as the reflector of the light-modulating member 70. The light-modulating member 70 may include both a gas and light-scattering particles as the reflector.

An example of a method for manufacturing the light-emitting device 1000 will now be described with reference to FIGS. 15A to 19.

Figure 15A:
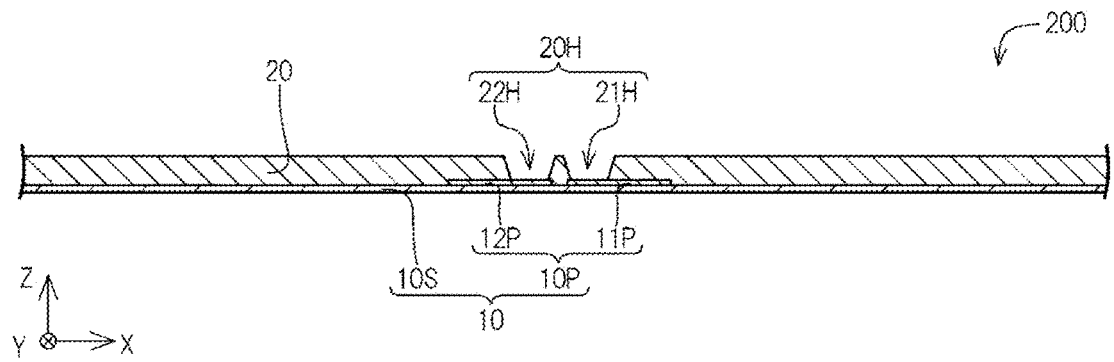
FIG. 15A is a schematic cross-sectional view showing a method for manufacturing the light-emitting device according to the embodiment.

As shown in FIG. 15A, an intermediate body 200 that includes the wiring substrate 10 and the reflecting member 20 positioned at the upper side of the wiring substrate 10 is prepared. The intermediate body 200 can be prepared by manufacturing or by assignment including procurement, etc. The wiring substrate 10 includes the wiring part 10P. The reflecting member 20 includes the reflecting through-hole 20H. At least a portion of the wiring part 10P is not covered with the reflecting member 20 inside the reflecting through-hole 20H. A reflecting member that does not include the reflecting through-hole 20H may be called an intermediate reflecting member. The process of preparing the intermediate body 200 may include a process of forming an intermediate reflecting member on the wiring substrate 10, and a process of forming the reflecting through-hole 20H in the intermediate reflecting member. The reflecting member 20 can be made by forming the reflecting through-hole 20H in the intermediate reflecting member. The reflecting through-hole 20H can be formed by a known method such as laser patterning, drilling, etc. For example, a $CO_2$ laser may be used to form the reflecting through-hole 20H. Debris that is generated by using the $CO_2$ laser may be removed by UV laser. Although not always described as such, the members in intermediate states in the processes may be prepared by assignment, etc.

Figure 15B:
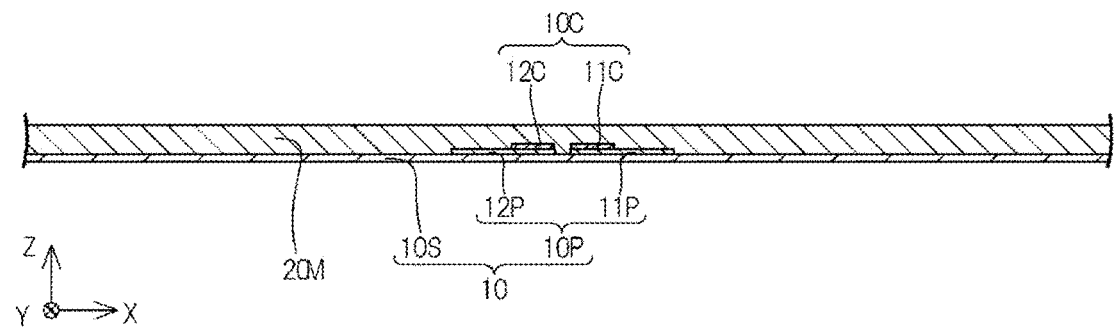
FIG. 15B is a schematic cross-sectional view showing a method of manufacturing a modification of the light-emitting device according to the embodiment.

The intermediate body 200 may include the conductive connecting member 10C that contacts the wiring part 10P. For example, as shown in FIG. 15B, first, an intermediate reflecting member 20M that covers the upper surface of the wiring part 10P and the upper surface of the connecting member 10C is formed. The method for forming the intermediate reflecting member 20M is not particularly limited. For example, the intermediate reflecting member 20M may be formed by coating a liquid intermediate reflecting member 20M before curing on the upper surface of the wiring part 10P and the upper surface of the connecting member 10C, and by curing the intermediate reflecting member 20M. The intermediate reflecting member 20M may be formed by providing the intermediate reflecting member 20M in the A-stage on the upper surface of the wiring part 10P and the upper surface of the connecting member 10C, and by curing the A-stage intermediate reflecting member 20M. In the specification, the A-stage refers to the uncured state. The uncured state refers to the state before the curing reaction has proceeded, in other words, the state before performing an operation to cause the curing reaction to proceed. Examples of the operation to cause the curing reaction to proceed include heating, light irradiation, etc. The curing reaction may proceed slightly before the operation to cause the curing reaction to proceed; and the uncured state includes such a state. The A-stage is taken to be a state that is not a liquid and is not fluidic. For example, an A-stage member can be a member formed by coating a liquid resin material including a solvent such as cyclohexane or the like on a support body, and then by making the solvent non-fluidic on the support body by volatilizing almost all of the solvent.

Figure 15C:
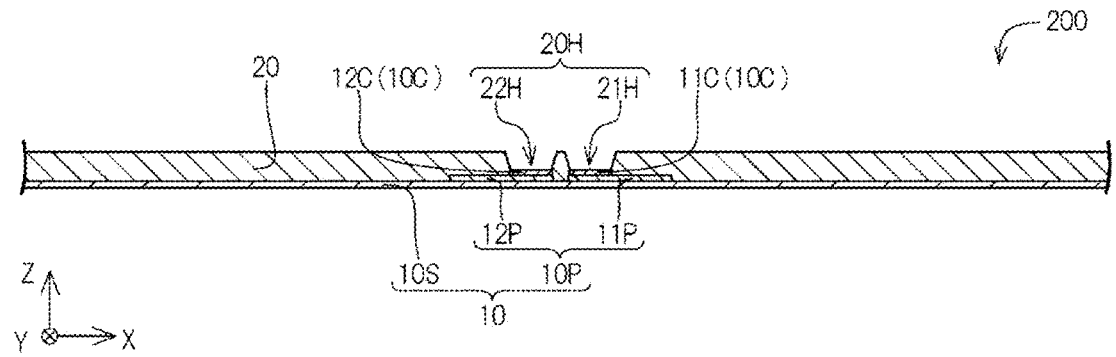
FIG. 15C is a schematic cross-sectional view showing the method of manufacturing the modification of the light-emitting device according to the embodiment.

After forming the intermediate reflecting member 20M that covers the upper surface of the wiring part 10P and the upper surface of the connecting member 10C, the reflecting member 20 is made as shown in FIG. 15C by forming the reflecting through-hole 20H in the intermediate reflecting member 20M. Thus, the intermediate body 200 that includes the wiring substrate 10 and the reflecting member 20 positioned at the upper side of the wiring substrate 10 may be prepared. At least a portion of the connecting member 10C is not covered with the reflecting member 20 inside the reflecting through-hole 20H. By including the connecting member 10C in the intermediate body 200, for example, damage of the wiring part 10P by laser light is more easily reduced when the reflecting through-hole 20H is formed by irradiating laser light. It is sufficient for the connecting member 10C to be positioned in at least a portion of the interior of the reflecting through-hole 20H when viewed in top-view. It is favorable for the connecting member 10C to be positioned at the entire surface inside the reflecting through-hole 20H when viewed in top-view. As a result, damage of the wiring part 10P due to laser light is more easily reduced when forming the reflecting through-hole 20H by irradiating laser light.

Figure 15D:
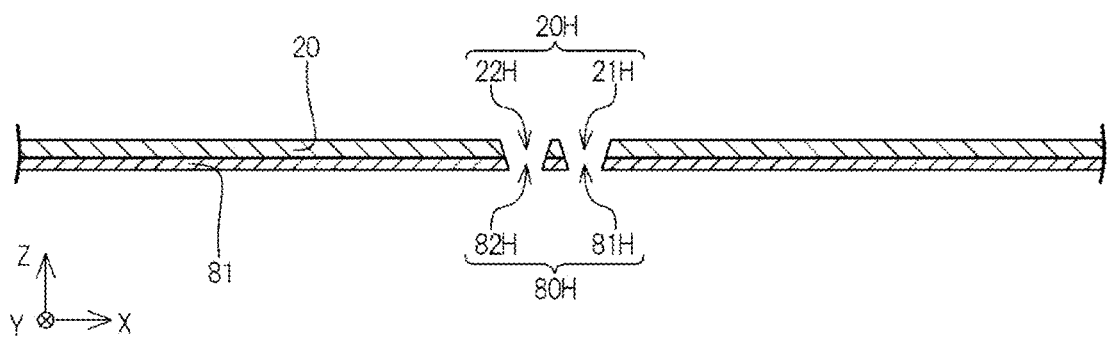
FIG. 15D is a schematic cross-sectional view showing a method of manufacturing a modification of the light-emitting device according to the embodiment.
Figure 15E:
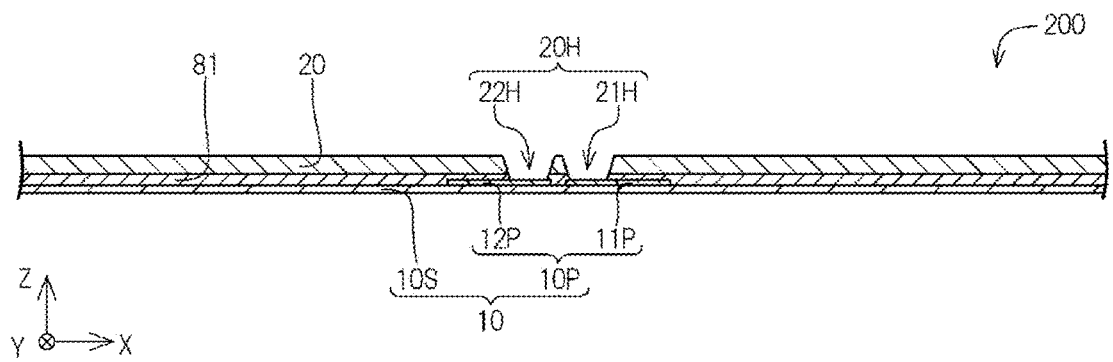
FIG. 15E is a schematic cross-sectional view showing the method of manufacturing the modification of the light-emitting device according to the embodiment.

The intermediate body 200 may include the first adhesive layer 81 positioned between the wiring substrate 10 and the reflecting member 20. For example, as shown in FIG. 15D, the first adhesive layer 81 that covers the reflecting member 20 and the lower surface of the reflecting member 20 is prepared. The reflecting member 20 includes the multiple reflecting through-holes 20H including the first and second through-holes 21H and 22H. The first adhesive layer 81 includes multiple bonding through-holes 80H including a first bonding through-hole 81H connected with the first through-hole 21H and a second bonding through-hole 82H connected with the second through-hole 22H. The reflecting through-hole 20H and the bonding through-hole 80H may be formed using a known method such as laser patterning, drilling, etc., after bonding a first adhesive layer and a reflecting member that does not include a through-hole; or, the reflecting member 20 that includes the reflecting through-hole 20H and the first adhesive layer 81 that includes the bonding through-hole 80H may be bonded. Then, the wiring substrate 10 and the reflecting member 20 are fixed via the first adhesive layer 81 as shown in FIG. 15E. Thus, the intermediate body 200 that includes the wiring substrate 10 and the reflecting member 20 positioned at the upper side of the wiring substrate 10 may be prepared.

Figure 16:
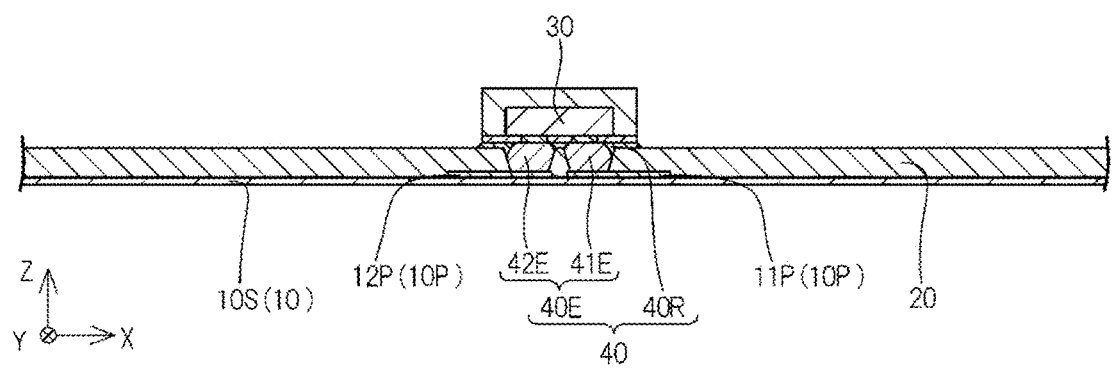
FIG. 16 is a schematic cross-sectional view showing the method of manufacturing the light-emitting device according to the embodiment.

After the intermediate body 200 is prepared, the wiring substrate 10 and the light source 30 are electrically connected by the bonding member 40 located in the reflecting through-hole as shown in FIG. 16. The bonding member 40 includes the conductive part 40E and the resin part 40R. The conductive part 40E electrically connects the wiring substrate 10 and the light source 30. The resin part 40R contacts the conductive part 40E, the light source 30, and the reflecting member 20. The bonding strength between the light source 30 and the reflecting member 20 is easily increased by the resin part 40R contacting the light source 30 and the reflecting member 20. A conductive paste in which metal particles used to form the conductive part 40E and flux used to form the resin part 40R are mixed may be used as the bonding member 40 before curing. As a result, the conductive part 40E and the resin part 40R can be formed by the same process. The resin part 40R that contacts the conductive part 40E may be formed after forming the conductive part 40E.

Figure 17:
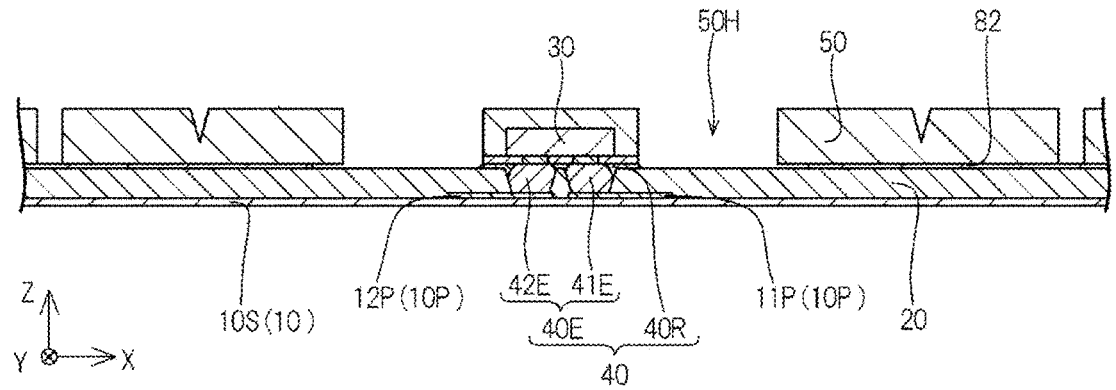
FIG. 17 is a schematic cross-sectional view showing the method of manufacturing the light-emitting device according to the embodiment.

After electrically connecting the wiring substrate 10 and the light source 30 by the bonding member 40, the light guide member 50 is placed at the upper side of the reflecting member 20 as shown in FIG. 17. The light guide member 50 includes the light guide through-hole 50H. The light source 30 is positioned in the light guide through-hole 50H. The reflecting member 20 and the light guide member 50 are fixed by the second adhesive layer 82 located between the reflecting member 20 and the light guide member 50.

Figure 18:
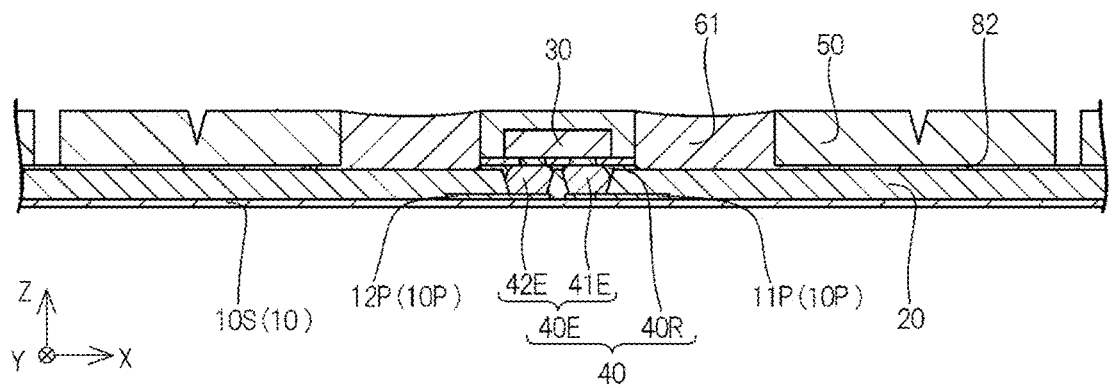
FIG. 18 is a schematic cross-sectional view showing the method of manufacturing the light-emitting device according to the embodiment.

After placing the light guide member 50 at the upper side of the reflecting member 20, the first light-transmitting part 61 that covers the side surface of the light source 30 is formed as shown in FIG. 18. After forming the first light-transmitting part 61 covering the side surface of the light source 30, the light-modulating member 70 is fixed to the first light-transmitting part 61 by the second light-transmitting part 62. The light-emitting device 1000 shown in FIG. 3 can be manufactured thereby. When the light-emitting device does not include the second light-transmitting part 62, the first light-transmitting part 61 and the light-modulating member 70 may be directly bonded.

Figure 19:
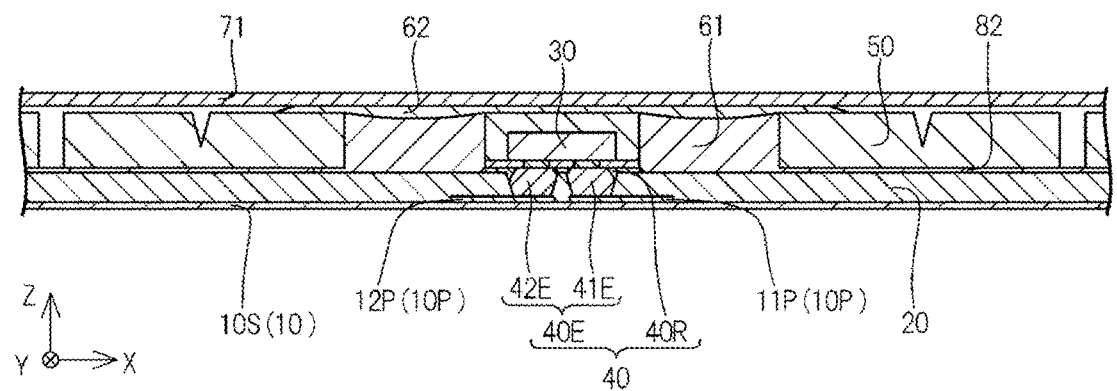
FIG. 19 is a schematic cross-sectional view showing the method of manufacturing the light-emitting device according to the embodiment.

In the specification, the light-modulating member 70 that does not include the light-modulating hole part 70A may be called a light-modulating intermediate member 71. As shown in FIG. 19, the light-modulating intermediate member 71 may be fixed to the first light-transmitting part 61 by the second light-transmitting part 62. After the light-modulating intermediate member 71 and the first light-transmitting part 61 are fixed by the second light-transmitting part 62, the light-modulating hole part 70A may be formed in the light-modulating intermediate member 71 by a known method such as laser patterning, drilling, etc. The light-modulating member 70 can be made by forming the light-modulating hole part 70A in the light-modulating intermediate member 71.

The embodiments described above are examples of the present disclosure. As such, the present disclosure is not limited to these embodiments. For example, those resulting from adding to, removing from, or modifying certain constituent elements or processes in the embodiments described above are also encompassed by the present disclosure. The embodiments described above, moreover, can be implemented in combination with one another.

The invention claimed is:

1. A light-emitting device, comprising:
 a wiring substrate including a first wiring part and a second wiring part at an upper surface of the wiring substrate;
 a reflecting member positioned at an upper side of the wiring substrate, the reflecting member having a first through-hole including a first inclined surface spreading upward;
 a light source positioned at an upper side of the reflecting member, the light source including a first electrode and a second electrode; and
 a bonding member including
  a first conductive part positioned in the first through-hole, the first conductive part electrically connecting the first wiring part and the first electrode, and
  a resin part contacting the first inclined surface, the light source, and the first conductive part.

2. The light-emitting device according to claim 1, wherein
 the bonding member further includes a second conductive part electrically connecting the second wiring part and the second electrode,
 the reflecting member has a second through-hole including a second inclined surface spreading upward,
 the second conductive part is positioned in the second through-hole, and
 the resin part contacts the second inclined surface and the second conductive part.

3. The light-emitting device according to claim 2, wherein
 in a first cross section passing through the first and second electrodes in a direction perpendicular to the upper surface of the wiring substrate, a minimum length from an upper end of a portion of the first conductive part contacting the first inclined surface to an upper end of a portion of the second conductive part contacting the second inclined surface is less than a minimum length from the first wiring part to the second wiring part.

4. The light-emitting device according to claim 1, wherein
 a portion of the resin part is positioned outside the light source in a top view.

5. The light-emitting device according to claim 1, wherein
 in a first cross section passing through the first and second electrodes in a perpendicular direction that is perpendicular to the upper surface of the wiring substrate, the first inclined surface includes:
  a first-incline first surface positioned at the second electrode side; and
  a first-incline second surface facing the first-incline first surface, and
 a length in the perpendicular direction of a first portion of the resin part contacting the first-incline first surface is shorter than a length in the perpendicular direction of a second portion of the resin part contacting the first-incline second surface.

6. The light-emitting device according to claim 1, wherein
 the reflecting member includes a resin material,
 the light source includes:
  a light-emitting element; and
  a covering member including a resin material, and
 the resin part contacts the covering member.

7. The light-emitting device according to claim 1, wherein
 a refractive index of a base material of the resin part is greater than a refractive index of a base material of the reflecting member.

8. The light-emitting device according to claim 1, further comprising:
 a connecting member positioned inside the first through-hole in a top view,
 wherein the connecting member contacts the first wiring part and the first conductive part, and
 wherein the connecting member is conductive.

* * * * *